US010005956B2

(12) United States Patent
Swager et al.

(10) Patent No.: US 10,005,956 B2
(45) Date of Patent: Jun. 26, 2018

(54) COMPOSITIONS, ARTICLES, AND METHODS FOR DOWN-CONVERTING LIGHT AND OTHER APPLICATIONS

(71) Applicant: Massachusetts Institute of Technology, Cambridge, MA (US)

(72) Inventors: Timothy M. Swager, Newton, MA (US); Gregory D. Gutierrez, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 173 days.

(21) Appl. No.: 14/952,199

(22) Filed: Nov. 25, 2015

(65) Prior Publication Data
US 2016/0152890 A1 Jun. 2, 2016

Related U.S. Application Data

(60) Provisional application No. 62/084,918, filed on Nov. 26, 2014.

(51) Int. Cl.
*C09K 11/02* (2006.01)
*C09K 11/06* (2006.01)
*H01L 31/055* (2014.01)

(52) U.S. Cl.
CPC .............. *C09K 11/06* (2013.01); *C09K 11/02* (2013.01); *H01L 31/055* (2013.01); *C09K 2211/1029* (2013.01); *C09K 2211/1416* (2013.01); *C09K 2211/1458* (2013.01); *C09K 2211/1466* (2013.01); *C09K 2211/1483* (2013.01); *Y02E 10/52* (2013.01)

(58) Field of Classification Search
CPC . C09K 11/06; C09K 11/02; C09K 2211/1029; C09K 2211/1416; C09K 2211/1458; C09K 2211/1466; C09K 2211/1483; C09D 5/22
See application file for complete search history.

(56) References Cited

U.S. PATENT DOCUMENTS

| | | | |
|---|---|---|---|
| 5,425,125 A | 6/1995 | Holmes et al. | |
| 5,468,803 A | 11/1995 | Takahashi et al. | |
| 6,723,828 B2* | 4/2004 | Pei | C08G 61/10 428/690 |
| 6,916,928 B2 | 7/2005 | Becker et al. | |
| 7,098,297 B2* | 8/2006 | Pei | C08G 61/10 428/690 |
| 7,799,369 B2* | 9/2010 | Daniels | B82Y 20/00 427/256 |
| 8,802,447 B2 | 8/2014 | Swager et al. | |
| 2005/0184660 A1* | 8/2005 | Kern | H01L 51/0003 313/506 |
| 2011/0207114 A1 | 8/2011 | Kumar et al. | |
| 2013/0235323 A1 | 9/2013 | Sotzing et al. | |

FOREIGN PATENT DOCUMENTS

| | | | |
|---|---|---|---|
| EP | 1768466 | * | 7/2007 |
| WO | WO 2010/144469 A2 | | 12/2010 |

OTHER PUBLICATIONS

Baier et al., Fluorescent conjugated polymer nanoparticles by polymerization in miniemulsion. J Am Chem Soc. Oct. 14, 2009;131(40):14267-73. doi: 10.1021/ja905077c.
Bailey et al., Optimized excitation energy transfer in a three-dye luminescent solar concentrator. Solar Energy Materials and Solar Cells. 2007;91(1):67-75. Epub Sep. 26, 2006.
Batchelder et al., Luminescent solar concentrators. 2: Experimental and theoretical analysis of their possible efficiencies. Appl Opt. Nov. 1, 1981;20(21):3733-54. doi: 10.1364/AO.20.003733.
Bouffard et al., Fluorescent Conjugated Polymers That Incorporate Substituted 2,1,3-Benzooxadiazole and 2,1,3-Benzothiadiazole Units. Macromolecules. 2008;41(15):5559-62. Epub Jul. 12, 2008.
Bozdemier et al., Towards Unimolecular Luminescent Solar Concentrators: Bodipy-Based Dendritic Energy-Transfer Cascade with Panchromatic Absorption and Monochromatized Emission. Angew. Chem. Int. Ed. Nov. 11, 2011;50(46):10907-12.
Bredas et al., Electronic Structure of Poly(paraphenylene vinylene): Influence of copolymerization and Derivatization on Light-emitting Characteristics. Polym. Prepr. (Am. Chem. Sco., Div. Polym. Chem.) 1994;35:185-6.
Campoy-Quiles et al., Ellipsometric Characterization of the Optical Constants of Polyfluorene Gain Media. Adv. Funct. Mater. Jun. 2005;15(6):925-33. Epub May 27, 2005.
Cordovilla et al., Strain release in organic photonic nanoparticles for protease sensing. J Am Chem Soc. Apr. 25, 2012;134(16):6932-5. doi: 10.1021/ja301259v. Epub Apr. 10, 2012.
Coropceanu et al., Core/shell quantum dot based luminescent solar concentrators with reduced reabsorption and enhanced efficiency. Nano Lett. Jul. 9, 2014;14(7):4097-101. doi: 10.1021/nl501627e. Epub Jun. 6, 2014.
Currie et al., High-Efficiency Organic Solar Concentrators for Photovoltaics. Science. Jul. 11, 2008;321(5886):226-8.
Debije et al., Thirty Years of Luminescent Solar Concentrator Research: Solar Energy for the Built Environment. Advanced Energy Materials. Jan. 2012;2(1):12-35. Epub Dec. 12. 2011.
Dienel et al., Spectral-based analysis of thin film luminescent solar concentrators. Solar Energy. Aug. 31, 2010;84(8):1366-9.
Gutierrez et al., A Low Reabsorbing Luminescent Solar Concentrator Employing π-Conjugated Polymers. Adv Mater. Jan. 20, 2016;28(3):497-501. doi: 10.1002/adma.201504358. Epub Nov. 24, 2015.
Gutierrez et al., Design and Evaluation of a Conjugated Polymer Amplifying Luminescent Solar Concentrator. 2014 MRS Fall Meeting. Boston, MA. Dec. 4, 2014. Abstract. 1 page.

(Continued)

*Primary Examiner* — C Melissa Koslow
(74) *Attorney, Agent, or Firm* — Wolf, Greenfield & Sacks, P.C.

(57) ABSTRACT

The present invention generally relates to compositions, articles, and methods for down-converting light and other applications. In some embodiments, the articles comprise a substrate and a composition comprising one or more types of polymers and one or more additives. In certain embodiments, the one or more additives comprise a light-emitting dye and/or a diluent matrix.

9 Claims, 17 Drawing Sheets

(56) References Cited

OTHER PUBLICATIONS

Hardin et al., Increased light harvesting in dye-sensitized solar cells with energy relay dyes. Nature Photonics. 2009;3:406-11. Epub Jun. 21, 2009.
Hermann, Luminescent solar concentrators—A review. Solar Energy. 1982;29(4):323-9.
Huang et al., Enhancing solar cell efficiency: the search for luminescent materials as spectral Jan. 7, 2013;42(1):173-201. doi: 10.1039/c2cs35288e. Epub Oct. 16, 2012.
Klok et al., Star-shaped fluorescent polypeptides. Polymer Chemistry. May 15, 2001;39(10):1572-83. Epub Mar. 27, 2001.
Lamba et al., Imine-Bridged Planar Poly(p-phenylene) Derivatives for Maximization of Extended .pi.-Conjugation. The Common Intermediate Approach. J. Am. Chem. Soc. Dec. 1994;116(26):11723-36.
Levine et al., Photoluminescent energy transfer from poly(phenyleneethynylene)s to near-infrared emitting fluorophores. J. Poly. Sci.Part A: Poly. Chem. Aug. 1, 2010;48(15):3382-91. Epub Jun. 25, 2010.
Long et al., Molecular Design of Free Volume as a Route to Low-κ Dielectric Materials. J. Am. Chem. Soc. 2003;125(46):14113-9. Epub Oct. 17, 2003.
McFarland, Solar energy: setting the economic bar from the top-down. Energy Environ. Sci. 2014;7:846-54. Epub Jan. 7, 2014.
Meinardi et al., Large-area luminescent solar concentrators based on 'Stokes-shift-engineered' nanocrystals in a mass-polymerized PMMA matrix. Nature Photonics. 2014;8:392-9. Epub Apr. 13, 2014.
Morin et al., Syntheses of Conjugated Polymers Derived from N-Alkyl-2,7-carbazoles. Macromolecules. 2001;34(14):4680-2. Epub Jun. 6, 2001.
Mulder et al., Luminescent Solar Concentrators Employing Phycobilisomes. Advanced Materials. Aug. 21, 2009;21(31):3181-5. Epub Apr. 20, 2009.
Nagarjuna et al., A straightforward route to electron transporting conjugated polymers. Journal of Materials Chemistry. 2012;22:16091-4. Epub Jun. 21, 2012.
Nesterov et al., Conjugation Enhancement of Intramolecular Exciton Migration in Poly(p-phenylene ethynylene)s. J. Am. Chem. Soc. 2005;127(28):10083-8. Epub Jun. 23, 2005.
Olson et al., Luminescent solar concentrators and the reabsorption problem. Appl Opt. Sep. 1, 1981;20(17):2934-40. doi: 10.1364/AO.20.002934.
Ramsdale et al., Ellipsometric Determination of Anisotropic Optical Constants in Electroluminescent Conjugated Polymers. Advanced Materials. Feb. 2002;14(3):212-5. Epub Jan. 29, 2002.
Reisfeld et al., Luminescent solar concentrators based on thin films of polymethylmethacrylate on a polymethylmethacrylate support. Solar Energy Materials. Oct. 1988;17(6):439-55.
Rowan et al., Advanced Material Concepts for Luminescent Solar Concentrators. IEEE Journal of Selected Topics in Quantum Electronics. 2008;14(5):1312-22. Epub May 14, 2008.
Sanguineti et al., High Stokes shift perylene dyes for luminescent solar concentrators. Chem Commun (Camb). Feb. 25, 2013;49(16):1618-20. doi: 10.1039/c2cc38708e.
Slooff et al., A luminescent solar concentrator with 7.1% power conversion efficiency. Phys. Stat. Sol. Dec. 2008;2(6):257-9. Epub Sep. 29, 2008.
Swager et al., Fluorescence Studies of Poly(p-phenyleneethynylene)s: The Effect of Anthracene Substitution. J. Phys. Chem. Apr. 1995;99(14):4886-93.
Swager, Iptycenes in the Design of High Performance Polymers. Acc. Chem. Res. 2008;41(9):1181-9. Epub Aug. 30, 2008.
Sydlik et al., Triptycene Polyimides: Soluble Polymers with High Thermal Stability and Low Refractive Indices. Macromolecules. 2011;44(4):976-80. Epub Jan. 26, 2011.
Ten Kate et al., Quantifying self-absorption losses in luminescent solar concentrators. Appl Opt. Aug. 10, 2014;53(23):5238-45. doi: 10.1364/AO.53.005238.
Thomas, III et al., Chemical Sensors Based on Amplifying Fluorescent Conjugated Polymers. Chem. Rev. 2007;107(4):1339-86. Epub Mar. 27, 2007.
Thomas, III et al., Synthesis and Optical Properties of Simple Amine-Containing Conjugated Polymers. Macromolecules. 2005;38(7):2716-21. Epub Mar. 5, 2005.
Wilson et al., Characterization and reduction of reabsorption losses in luminescent solar concentrators. Appl Opt. Mar. 20, 2010;49(9):1651-61. doi: 10.1364/AO.49.001651.
Würthner, Perylene bisimide dyes as versatile building blocks for functional supramolecular architectures. Chem Commun (Camb). Jul. 21, 2004;14:1564-79. Epub May 12, 2004.
Yang et al., Fluorescent Porous Polymer Films as TNT Chemosensors: Electronic and Structural Effects. J. Am. Chem. Soc. 1998;120(46):11864-73. Epub Nov. 11, 1998.
International Search Report and Written Opinion for Application No. PCT/US2015/062657 dated Mar. 31, 2016.
International Preliminary Report on Patentability dated Jun. 8, 2017 for Application No. PCT/US2015/062657.

* cited by examiner

P1

P2

P3

P4

P5

Red305  tBuRed305

COMPOSITIONS, ARTICLES, AND METHODS FOR DOWN-CONVERTING LIGHT AND OTHER APPLICATIONS

RELATED APPLICATIONS

This application claims priority under 35 U.S.C. § 119(e) to U.S. Provisional Application Ser. No. 62/084,918, filed Nov. 26, 2014, which is incorporated herein by reference in its entirety for all purposes.

FIELD OF THE INVENTION

The present invention generally relates to compositions, articles, and methods for down-converting light and other applications.

BACKGROUND

In an effort to increase the viability of solar radiation as a widespread and accessible class of renewable energy, researchers are actively developing solutions to lower the cost of deploying highly efficient photovoltaic (PV) devices for power generation. One approach is to use an inexpensive platform capable of focusing energy to a set of small PV cells, a strategy that is the basis of the luminescent solar concentrator (LSC). LSCs generally comprise transparent plastic or glass slabs that contain photoluminescent dyes whose resulting emission upon exposure to sunlight is guided by the slab through total internal reflection to smaller PV cells attached at the edges of the device. Because of their ability to collect diffuse light without the need to track the sun's location at any given part of the day, LSCs may be conveniently incorporated into various residential or commercial infrastructures to produce energy-efficient establishments. Although promising architectures for economic and strategic solar installations, conventional LSCs are often plagued by a multitude of unfavorable processes that curb their ability to efficiently deliver light to PV cells.

Accordingly, improved compositions and methods are needed.

SUMMARY OF THE INVENTION

The present invention generally provides compositions, articles, and methods for down-converting light and other applications.

In one aspect, articles are provided. In some embodiments, the article comprises a substrate and a composition associated with at least one surface of the substrate, the composition comprising a first type of conjugated polymer, a second type of conjugated polymer, and a light-emitting dye.

In some embodiments, the article comprises a substrate and a composition associated with at least one surface of the substrate, wherein the composition comprises a first type of conjugated polymer, a second type of conjugated polymer, and a diluent matrix, wherein the first type of polymer and the second type of polymer are phase separated into microdomains within the diluent matrix.

In some embodiments, the article comprises a substrate and a composition associated with at least one surface of the substrate, wherein the composition comprises a first type of conjugated polymer having a first band gap, a second type of conjugated polymer having a second band gap, and a diluent matrix or light-emitting dye having a third band gap, wherein the third band gap is less than the first band gap and the second band gap.

In some embodiments, the article comprises a substrate having a first average index of refraction and a composition associated with at least one surface of the substrate, the composition having a second average index of refraction, wherein the composition comprises a first type of conjugated polymer and a second type of conjugated polymer, wherein the percent difference between the first average index of refraction and the second average index of refraction is less than about 15%.

In some embodiments, the article comprises a substrate and a composition associated with at least one surface of the substrate, the composition comprising a first type of conjugated polymer and a second type of conjugated polymer comprising a light-emitting dye.

In yet another aspect, methods for down-converting light are provided. In some embodiments, the method comprises exposing a composition comprising a first type of conjugated polymer, a second type of conjugated polymer, and a light-emitting dye to light having a first average wavelength, such that the composition emits light having a second average wavelength, wherein the second average wavelength is greater than the first average wavelength.

In some embodiments, the method comprises exposing a composition comprising a first type of conjugated polymer, a second type of conjugated polymer, and a diluent matrix to light having a first average wavelength, such that the composition emits light having a second average wavelength, wherein the second average wavelength is greater than the first average wavelength.

In another aspect, polymers are provided. In some embodiments, the polymer comprises the structure as in Formula (II):

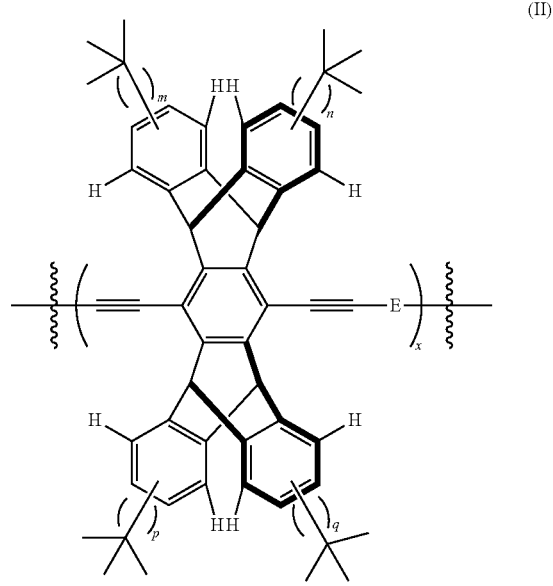

(II)

wherein each E is independently an optionally substituted aryl ring system or optionally substituted heteroaryl ring system, n, m, p, and q are each independently 0 or 1, provided m+n+p+q is at least 1, and x is at least 1.

In some embodiments, the polymer comprises a structure as in:

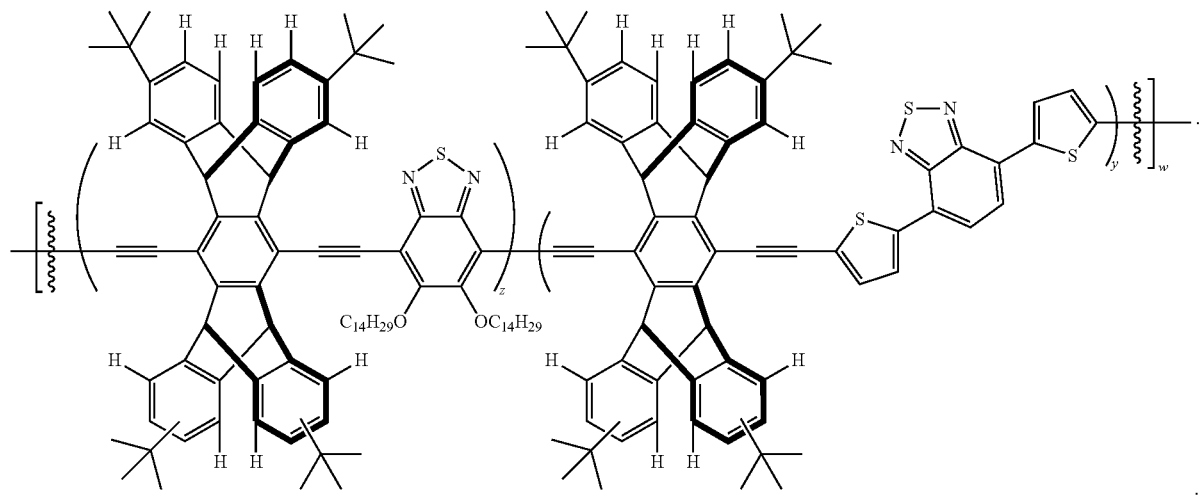
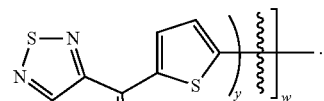

wherein each z is independently 1 or more, each y is independently 0 or more, and w is at least 1.

In some embodiments, the polymer comprises a structure as in:

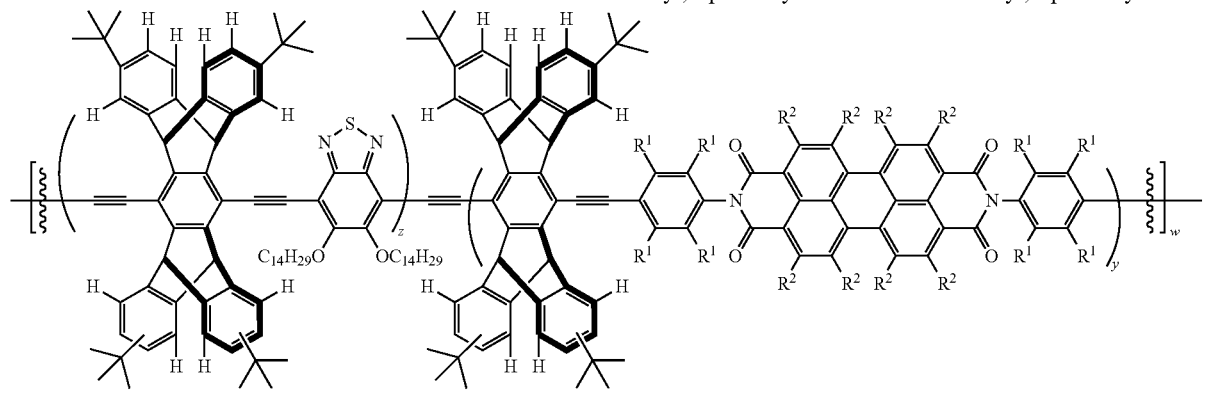

wherein each z is independently 1 or more, each y is independently 0 or more, w is at least 1, and each $R^1$ is the same or different and are independently hydrogen or isopropyl, and each $R^2$ is the same or different and are independently hydrogen or an aryloxy group.

In some embodiments, the polymer comprises a structure as in:

wherein x is 1 or more and each $R^3$ is the same or different and are independently hydrogen, cyano, halide, hydroxyl, amino, optionally substituted alkoxy, optionally substituted alkyl, optionally substituted heteroalkyl, optionally substituted aryl, optionally substituted heteroaryl, or optionally substituted aryloxy. In some embodiments, each $R^3$ is the same or different and are independently hydrogen or optionally substituted aryloxy.

Other advantages and novel features of the present invention will become apparent from the following detailed description of various non-limiting embodiments of the

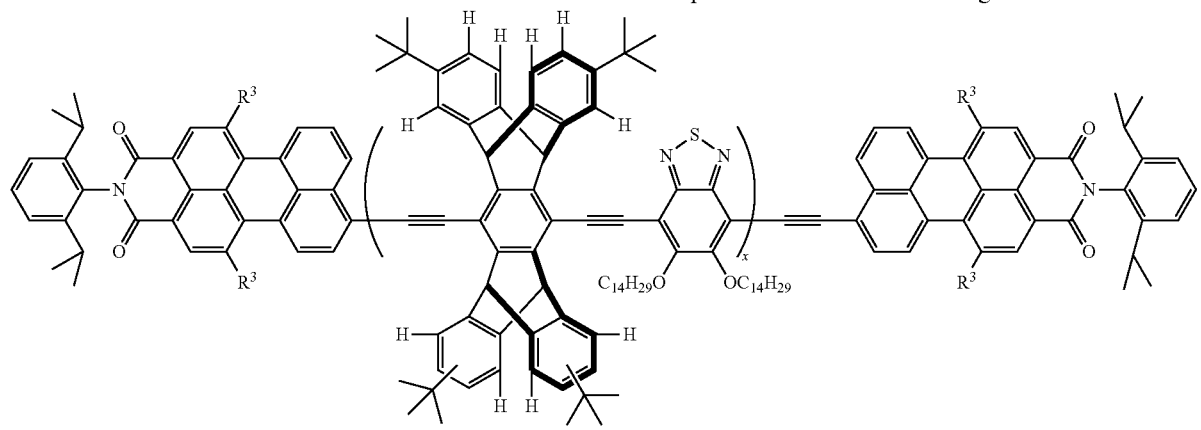

invention when considered in conjunction with the accompanying figures. In cases where the present specification and a document Incorporated by reference include conflicting and/or inconsistent disclosure, the present specification shall control. If two or more documents incorporated by reference include conflicting and/or inconsistent disclosure with respect to each other, then the document having the later effective date shall control.

Figure 1:
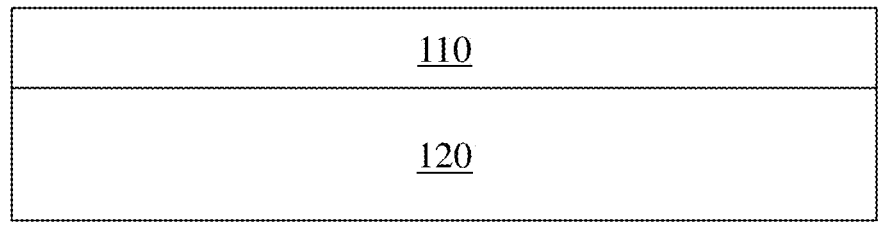
FIG. 1 shows a schematic representation of an article comprising a composition and a substrate, according to some non-limiting embodiments.

Other aspects, embodiments and features of the invention will become apparent from the following detailed description when considered in conjunction with the accompanying drawings. The accompanying figures are schematic and are not intended to be drawn to scale. For purposes of clarity, not every component is labeled in every figure, nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

Compositions, articles, and methods for down-converting light (e.g., for solar cells) and other applications are generally provided. In some embodiments, the articles, and methods comprise a composition and a substrate. In certain embodiments, the composition comprises two or more types of polymers and a light-emitting dye and/or a diluent matrix. In some such embodiments, the light-emitting dye and/or diluent matrix has a band gap (e.g., an optical band gap) less than the bandgap of each of the two or more types of polymers. In some embodiments, the composition has an index of refraction similar to the index of refraction of the substrate. In certain embodiments, the composition and the substrate are each in direct contact with (e.g., at least a portion of a surface of the composition and/or the substrate are in direct contact with) a photovoltaic component.

The articles and polymers described herein may be useful, in some cases, for down-converting light in a luminescent solar concentrator (LSC). LSCs are generally used to guide light through internal reflection to small photovoltaic components (e.g., photovoltaic cells) attached to the edge of a device (e.g., to direct and/or concentrate light, such as sunlight, to the photovoltaic components). The articles and compositions described herein offer several advantages over traditional down-converting materials and LSCs, including, but not limited to, low reabsorption of light by the LSC, the ability to form thin film LSCs with broad absorption in the solar spectrum, and/or the ability to incorporate low cost aggregated domains (e.g., microdomains) of polymers for amplifying luminescence incorporated into commercially available polymers (e.g., poly(methyl methacrylate)). By contrast, traditional LSCs generally suffer from non-radiative reabsorption by the LSC materials (e.g., photoluminescent dyes) as well as relatively poor light harvesting by the LSC materials themselves. Furthermore, the compositions described herein offer an advantage of a significant reduction and/or elimination of quenching of luminescence as compared to traditional LSC polymers. Such articles and compositions may be scaled to commercially relevant sizes for incorporation into buildings (e.g., windows) and other structures for inexpensive and sustainable solar energy collection.

In some embodiments, the article comprises a substrate and a composition. In some embodiments, as illustrated in FIG. 1 article 100 comprises composition 110 associated with substrate 120. "Association" of the composition with the substrate would be understood by those of ordinary skill in the art based on this description. The term "association", as used herein, generally refers to the contact (e.g., direct contact) between two or more components of the article (e.g., between the composition and the substrate). For example, in some embodiments, the composition is associated with (e.g., is in direct contact with) at least a portion of a surface of the substrate. In certain embodiments, the composition is substantially associated with a surface of the substrate (e.g., substantially all of the surface). In some cases, the composition may be associated with one or more surfaces of the substrate (e.g., at least a portion of a first surface of the substrate and at least a portion of a second surface of the substrate).

In some embodiments, the composition comprises one or more types of polymers, which are described in more detail herein. In some embodiments, the composition comprises two types of polymers which are different from each other. In some embodiments, the composition comprises three types of polymers which are each different from each other. For example, the different types of polymers may comprise different structures and/or have different molecular weights. In certain embodiments, the composition comprises one or more additives (e.g., a light-emitting dye, a diluent matrix), which are described in more detail herein. For example, in some embodiments, the composition comprises two or more types of polymers (e.g., two or more types of poly(arylene ethynylene)s) and a light-emitting dye. In alternative embodiments, the composition comprises two or more types of polymers (e.g., two or more types of poly(arylene ethynylene)s) and a diluent matrix. In certain embodiments, the composition comprises two or more types of polymers, a light-emitting dye, and a diluent matrix. In some embodiments, the composition comprises a first type of polymer and a second type of polymer comprising a light-emitting dye. In some embodiments, the second type of polymer comprises a monomer comprising a light-emitting dye. In certain embodiments, the second type of polymer comprises an end-capping group comprising a light-emitting dye.

In some cases, a composition and/or article may only comprise only a single polymer. In some cases, the single polymer may be a conjugated polymer comprising a light-emitting dye. In some embodiments, the single polymer comprises a monomer comprising a light-emitting dye. In certain embodiments, the single polymer comprises an end-capping group comprising a light-emitting dye.

In some embodiments, the polymers and/or additives have certain desirable properties (e.g., band gaps, refractive indices, phase separation properties, etc.) which permit the down-conversion of light and/or proper waveguiding of light (e.g., to the optional photovoltaic components).

The term polymer is given its ordinary meaning in the art and generally refers to extended molecular structures comprising a backbone (e.g., non-conjugated backbone, conjugated backbone) which optionally contain pendant side groups, where "backbone" refers to the longest continuous bond pathway of the polymer. In some embodiments, at least a portion of a polymer is conjugated or pi-conjugated, i.e. the polymer has at least one portion along which electron density or electronic charge can be conducted, where the electronic charge is referred to as being "delocalized." Each p-orbital participating in conjugation can have sufficient overlap with adjacent conjugated p-orbitals. In one embodiment, at least a portion of the backbone is conjugated. In one embodiment, the entire backbone is conjugated and the polymer is referred to as a "conjugated polymer." Polymers having a conjugated pi-backbone capable of conducting electronic charge may be referred to as "conducting polymers." In some cases, the conjugated pi-backbone may be defined by a plane of atoms directly participating in the conjugation, wherein the plane arises from a preferred arrangement of the p-orbitals to maximize p-orbital overlap, thus maximizing conjugation and electronic conduction. In some cases, the pi-backbone may preferably have a non-planar or twisted ground state conformation, leading to decreased conjugation and a higher energy conduction band.

In some embodiments, the polymer (e.g., the conjugated polymer) comprises a sterically bulky monomer. In some cases, the sterically bulky monomer may aid in preserving the optical properties of the polymer or oligomer, even in the solid state. That is to say, the use of sterically bulky monomers may prevent adjacent or nearby neighboring molecules from interacting with each other through, for example, pi-stacking, to cause a decrease in emission. In some cases, the bulky monomer may comprise a non-planar, bicyclic group that is rigidly attached to the polymer backbone, wherein the bicyclic group comprises bridgehead atoms that are not adjacent to one another. A "rigid" group refers to a group that does not easily rotate about a bond axis, preferably a bond that binds the rigid group to the polymer. In one embodiment, the rigid group rotates no more than about 180°, or, in another embodiment, by no more than about 120°, or by no more than about 60°. Certain types of rigid groups can provide a polymer with a backbone separated from an adjacent backbone at a distance of at least about 4.5 Å, or in another embodiment at least about 5.0 Å. In one embodiment, the rigid groups are incorporated as pendant groups. Examples of bulky monomers may include monomers comprising surfactants, proteins, or sterically large and/or non-planar organic groups such as pentiptycenes having five arene planes, triptycenes having three arene planes, or other iptycene and iptycene-related moieties.

In certain embodiments, the one or more types of polymers (e.g., one type of polymer, two types of polymers, three types of polymers, etc.) is selected from the group consisting of polyarylenes, polyarylene vinylenes, polyarylene ethynylenes and ladder polymers (i.e. polymers having a backbone that can only be severed by breaking two bonds). Non-limiting examples of ladder polymers include polythiophene, polypyrrole, polyacetylene, polyphenylene and substituted derivatives thereof.

In some embodiments, the polymer (e.g., the conjugated polymer) comprises a structure as in Formula (I),

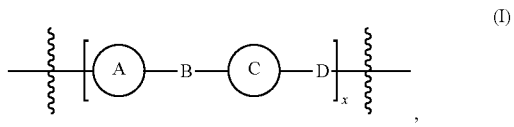

wherein x is at least 1, each A and C are independently optionally substituted aromatic groups, and each B and D are independently absent, optionally substituted alkene, alkyne, optionally substituted heteroalkene, or heteroalkyne. For example, in some embodiments, x may be between 2 and $10^6$.

In other embodiments of the invention, poly(arylene ethynylene)s are utilized, wherein B and D are alkynes. In some cases, each A may be an optionally substituted pentiptycene, triptycene, and/or other iptycene, each C may be a optionally substituted aromatic group, and B and D may each be alkyne.

In some cases, the polymer (e.g., the conjugated polymer) comprises a structure as in Formula (II),

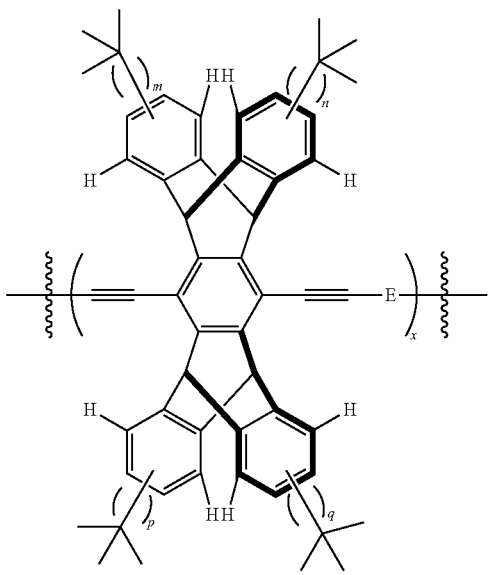

(II)

wherein each E is independently an optionally substituted aryl ring system or optionally substituted heteroaryl ring system, n, m, p, and q are each independently 0 or 1, and x is at least 1. In some embodiments, each x is independently between 2 and $10^6$. In certain embodiments, each x is independently greater than or equal to 1, greater than to 2, greater than or equal to 5, greater than or equal to 10, greater than or equal to 20, greater than or equal to 50, greater than or equal to 100, greater than or equal to 1000, greater than or equal to 5000, or greater than or equal to $10^5$. In some embodiments, each x is independently less than or equal to $10^6$, less than or equal to $10^5$, less than or equal to 5000, less than or equal to 1000, less than or equal to 100, less than or equal to 50, less than or equal to 20, less than or equal to 10, less than or equal to 5, or less than or equal to 2.

In some embodiments, m+n+p+q is zero (e.g., the polymer does not comprise any tert-butyl groups). In certain embodiments, m+n+p+q is at least 1 (e.g., m+n+p+q is 1, m+n+p+q is 2, m+n+p+q is 3, m+n+p+q is 4) In some embodiments, E has the structure as in,

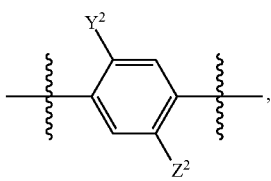

wherein each $Y^2$ and $Z^2$ are the same or different and are independently optionally substituted alkyl or optionally substituted heteroalkyl. In some embodiments, $Y^2$ and $Z^2$ are joined together to form a ring. In some embodiments, $Y^2$ and $Z^2$ comprise the structure $OC_wH_{2w+1}$ (e.g., $OC_{14}H_{29}$), wherein w is at least 1 (e.g., w is 1-20). In a non-limiting embodiment, $Y^2$ and $Z^2$ are optionally substituted heteroalkyl such as ethylene glycol chains. As used herein, an ethylene glycol chain is given its ordinary meaning in the art and refers to a heteroalkyl chain comprising the formula "—$(OCH_2)_bCH_3$," which may be optionally substituted, wherein b is at least 1 (e.g., b is 1-20). In a non-limiting embodiment, $Y^2$ and $Z^2$ are each ethylene glycol chains substituted with a carboxylic acid group, such as a terminal carboxylic acid group (e.g., $(OCH_2)_b(CH_2)COOH$).

In some embodiments, E comprises optionally substituted aryl ring system or optionally substituted heteroaryl ring system. Non-limiting examples of optionally substituted aryl ring system or optionally substituted heteroaryl ring system include optionally substituted monocyclic aromatic groups (e.g., furans, pyrroles, thiophenes, imidazoles, pyrazoles, oxazoles, isoxazoles, thiazoles, benzenes, pyridines, pyrazines, pyrimidines, or the like) and optionally substituted bicyclic aromatic groups (e.g., indole, benzothiphene, naphthalenes, quinolones, or the like). Non-limiting examples of E include,

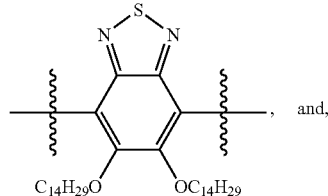

, and,

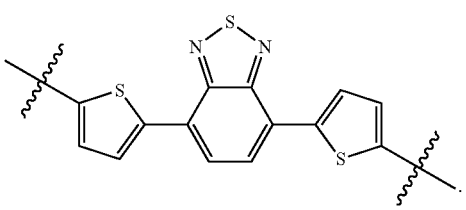 [SMILES: *c1ccc(-c2ccc(-c3ccc(*)s3)c3nsnc23)s1]

In certain embodiments, at least one E is a monomer comprising a light-emitting dye. Non-limiting examples of suitable monomers which are light-emitting dyes include acridine dyes, cyanine dyes, fluorone dyes, oxazine dyes, phenanthridine dyes, rhodamine dyes, perylene dyes, or the like. Those skilled in the art would be capable of selecting suitable monomers which are light-emitting dyes based upon the teachings of this description. For example, in some embodiments, at least one E is a monomer comprising a light-emitting dye having a structure as in:

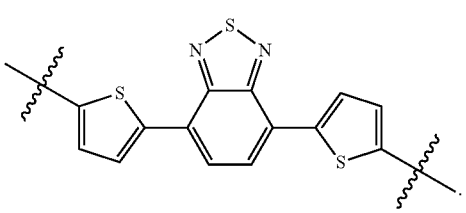

In certain embodiments, at least one E is a monomer comprising a light-emitting dye comprising a perylene bismide having a structure as in

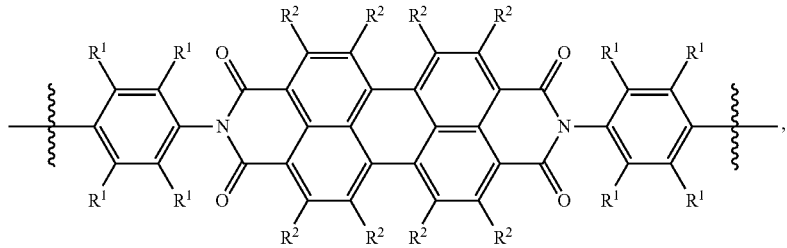

wherein each $R^1$ and each $R^2$ is the same or different and are independently hydrogen, cyano, halide, hydroxyl, amino, optionally substituted alkoxy, optionally substituted alkyl, optionally substituted heteroalkyl, optionally substituted aryl, or optionally substituted heteroaryl, or optionally substituted aryloxy. In a non-limiting embodiment, each $R^1$ is the same or different and are independently hydrogen or optionally substituted alkyl and each $R^2$ is the same or different and are independently hydrogen or optionally substituted aryloxy (e.g., —O-phenyl). In a non-limiting embodiment, each $R^1$ is the same or different and are independently hydrogen or isopropyl and each $R^2$ is the same or different and are independently hydrogen or optionally substituted aryloxy.

In some embodiments, at least one E is a monomer comprising a light-emitting dye such as a perylene bismide having a structure as in

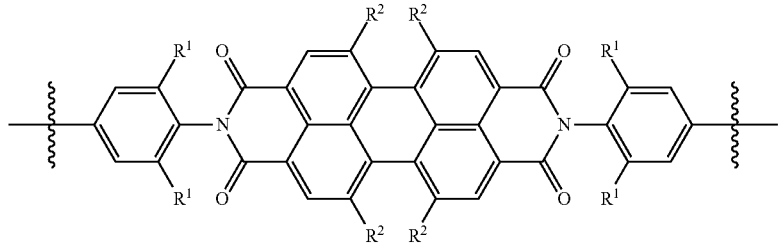

wherein each $R^1$ and each $R^2$ is the same or different and are independently hydrogen, cyano, halide, hydroxyl, amino, optionally substituted alkoxy, optionally substituted alkyl, optionally substituted heteroalkyl, optionally substituted aryl, or optionally substituted heteroaryl, or optionally substituted aryloxy. In a non-limiting embodiment, each $R^1$ is the same or different and are independently hydrogen or optionally substituted alkyl and each $R^2$ is the same or different and are independently hydrogen or optionally substituted aryloxy (e.g., —O-phenyl). In a non-limiting embodiment, each $R^1$ is the same or different and are independently hydrogen or isopropyl and each $R^2$ is the same or different and are independently hydrogen or optionally substituted aryloxy.

In an exemplary embodiment, at least one E is a monomer comprising a light-emitting dye having a structure as in

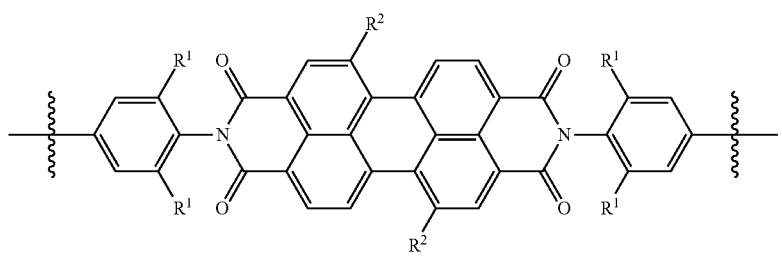

wherein each $R^1$ and $R^2$ are as described above. In some embodiments, each $R^1$ is the same or different and are independently hydrogen or optionally substituted alkyl (e.g., isopropyl), and each $R^2$ is the same or different and are independently hydrogen or optionally substituted aryloxy.

Figure 2A:
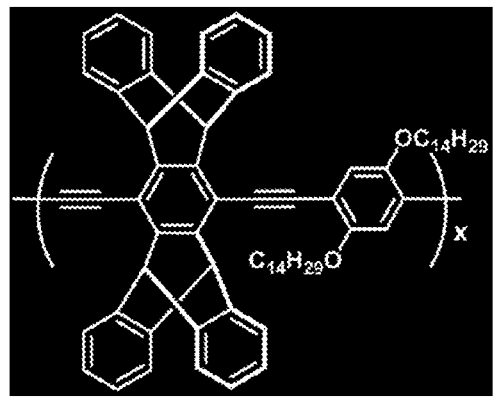
FIG. 2A shows the chemical structures of compounds that may be present in a composition, according to some non-limiting embodiments of the invention.
Figure 2A:
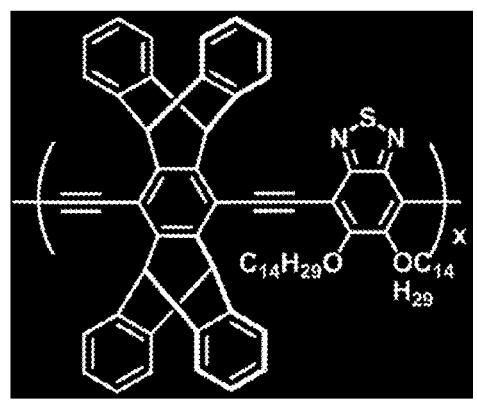
Figure 2A:
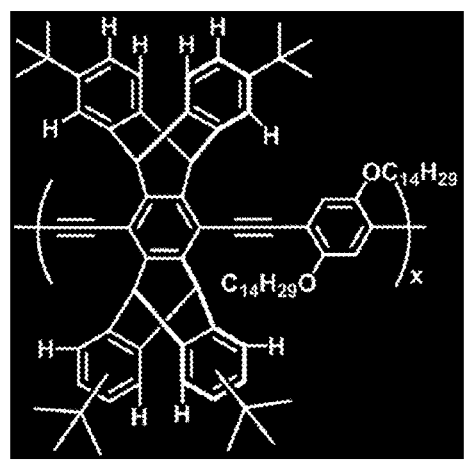
Figure 2A:
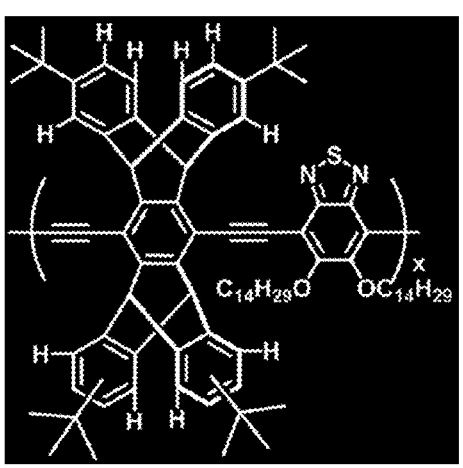
Figure 2A:
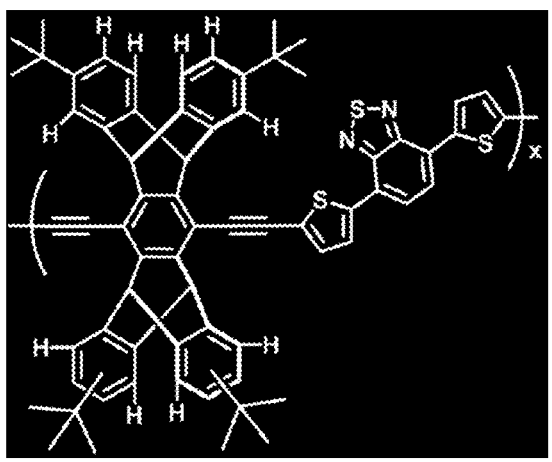

FIG. 2A shows non-limiting examples of polymers which may be utilized (e.g., polymers P1-P5). For example, in some embodiments, the composition comprises two types of poly(arylene ethynylene)s each comprising a structure as in Formula (I). In certain embodiments, the composition comprises two types of poly(arylene ethynylene)s each comprising a structure as in Formula (II). In some cases, the composition may comprise two types of poly(arylene ethynylene)s as shown in FIG. 2A (e.g., P1 and P2, P1 and P3, P1 and P4, P1 and P5, P2 and P3, P2 and P4, P2 and P5, P3 and P4, P3 and P5, P4 and P5).

It should be understood that polymers of the invention may be further substituted with additional functional groups, as described herein. Additional suitable polymers are known in the art and have been described in U.S. Pat. No. 8,802,447, issued on Aug. 12, 2014, and entitled "Emissive Compositions with Internal Standard and Related Techniques", which is incorporated herein by reference.

The polymers as described herein may be synthesized using techniques known to those of skill in the art. For example, see Yang, et al., *J. Am. Chem. Soc.* 1998, 120, 12389; Thomas III, et al., *Macromolecules* 2005, 38, 2716; Morin, et al., *Macromolecules* 2001, 34, 4680; Lamba, et al., *J. Am. Chem. Soc.* 1994, 116, 11723 and Bredas, et al., *Polym. Prepr.* (*Am. Chem. Sco., Div. Polym. Chem.*) 1994, 35, 185, each incorporated herein by reference.

In some embodiments, the properties of the polymers (e.g., the conjugated polymer) may be tuned based on a substitution of the conjugated polymer backbone. Those skilled in the art would recognize what types of functional groups would afford a particular, desired property, such as a particular band gap or a specific emission wavelength. For example, the polymer may be substituted with electron-poor groups, such as acyl, carboxyl, cyano, nitro, sulfonate, or the like, or the polymer may install electron-poor aryl groups in the backbone of the polymer, such that the polymer exhibits fluorescence emission at shorter wavelengths. In other embodiments, the monomers may be substituted with electron-rich groups, such as amino, hydroxy, alkoxy, acylamino, acyloxy, alkyl, halide, and the like, or the monomers may install electron-rich aryl groups in the backbone of the polymer, such that the polymer exhibits fluorescence emission at longer wavelengths. In some embodiments, the polymer may tailored to advantageously have a large Stokes shift, wherein the fluorescence spectrum is observed at a substantially longer wavelength than the excitation spectrum. In some embodiments, an electron-rich monomer may be co-polymerized with an electron-poor monomer to produce polymers having longer wavelength emission.

One or more polymers can be a homo-polymer or a co-polymer such as a random co-polymer or a block co-polymer. In some embodiments, the polymer is a block co-polymer. As described above, in some embodiments, the composition comprises a first type of polymer comprising a structure as in Formula (I) and a second type of polymer comprising a structure as in Formula (I) different than the first type of polymer, In certain embodiments, the second type of polymer comprises at least one monomer comprising a light-emitting dye. In some cases, the second type of polymer may be a co-polymer comprising at least one type of monomer comprising a light-emitting dye. For example, in some embodiments, the composition comprises a first type of polymer having a structure as in Formula (II) and a second type of polymer having a structure as in Formula (III):

wherein each $E^1$ and $E^2$ are the same or different and independently selected from E as described above, each n, each m, each p, and each q are independently 0 or 1, each z is independently 1 or more, each y is independently 0 or more, and w is at least 1. In some embodiments, each $E^1$ is the same or different and comprises optionally substituted aryl ring system or optionally substituted heteroaryl ring system, as described above, and each $E^2$ is the same or different and is a monomer comprising a light-emitting dye.

In some embodiments, each y is independently 0 to 1000, or 0 to 100, or 0 to 50, 0 to 10, or 0 to 5, or 0 to 4, or 0 to 3, or 0 to 2, or 0 to 1. In some embodiments, each y is independently 0 or 1.

In some embodiments, each z is independently between 2 and $10^6$. In certain embodiments, each z is independently greater than or equal to 1, greater than to 2, greater than or equal to 5, greater than or equal to 10, greater than or equal to 20, greater than or equal to 50, greater than or equal to 100, greater than or equal to 1000, greater than or equal to 5000, or greater than or equal to $10^5$. In some embodiments, each z is independently less than or equal to $10^6$, less than or equal to $10^5$, less than or equal to 5000, less than or equal to 1000, less than or equal to 100, less than or equal to 50, less than or equal to 20, less than or equal to 10, less than or equal to 5, or less than or equal to 2. Combinations of the above-referenced ranges are also possible (e.g., greater than or equal to 1 and less than or equal to $10^6$).

In some embodiments, w is at least 1. In some cases, w may be between 2 and $10^6$. In certain embodiments, w may be greater than or equal to 1, greater than to 2, greater than or equal to 5, greater than or equal to 10, greater than or equal to 20, greater than or equal to 50, greater than or equal to 100, greater than or equal to 1000, greater than or equal to 5000, or greater than or equal to $10^5$. In some embodiments, w may be less than or equal to $10^6$, less than or equal to $10^5$, less than or equal to 5000, less than or equal to 1000, less than or equal to 100, less than or equal to 50, less than or equal to 20, less than or equal to 10, less than or equal to 5, or less than or equal to 2. Combinations of the above-referenced ranges are also possible (e.g., greater than or equal to 1 and less than or equal to $10^6$).

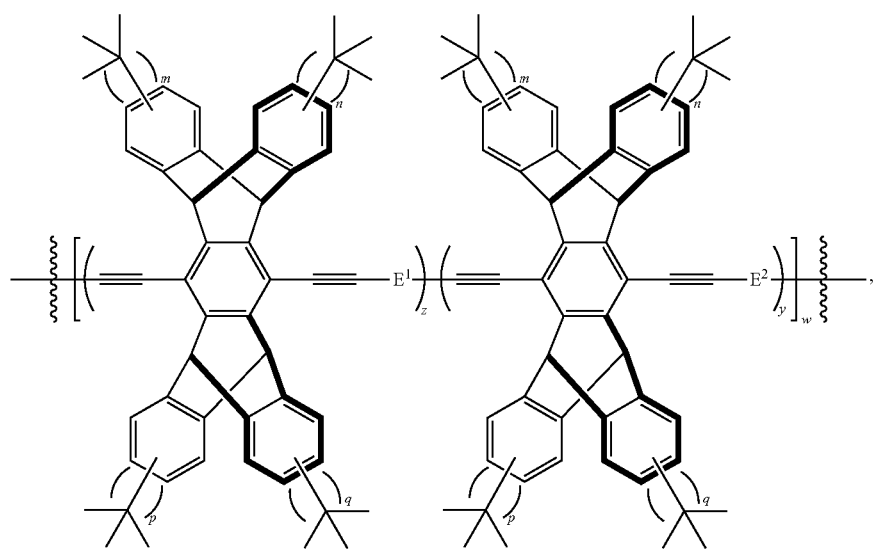

(III)

In some embodiments, $E^1$ is

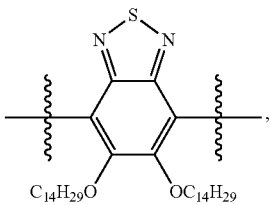

and $E^2$ is

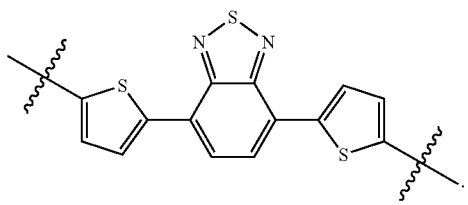 [SMILES: *c1ccc(-c2ccc(-c3ccc(*)s3)c3nsnc23)s1]

In certain embodiments, $E^1$ is

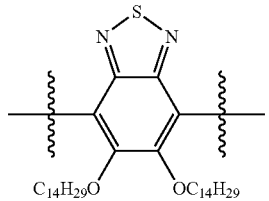

and $E^2$ is

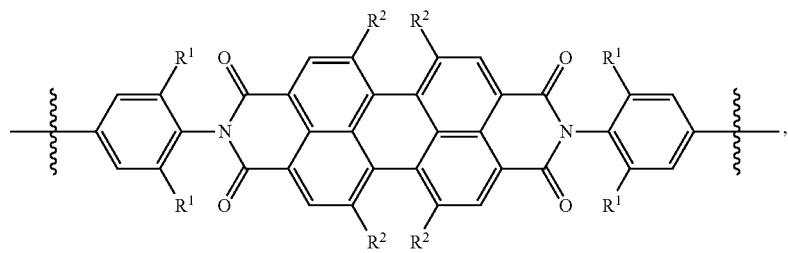

wherein each $R^1$ and each $R^2$ is the same or different and are independently hydrogen, cyano, halide, hydroxyl, amino, optionally substituted alkoxy, optionally substituted alkyl, optionally substituted heteroalkyl, optionally substituted aryl, or optionally substituted heteroaryl, or optionally substituted aryloxy.

Non-limiting examples of suitable co-polymers comprising light-emitting dyes include:

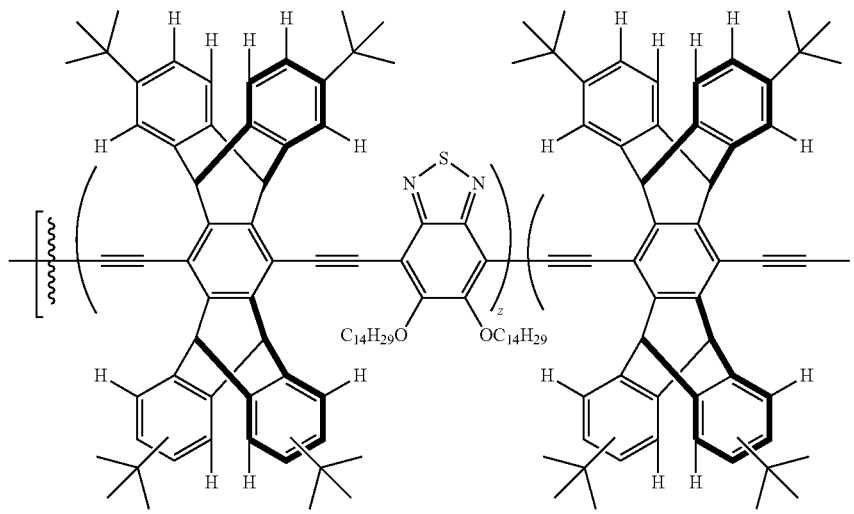

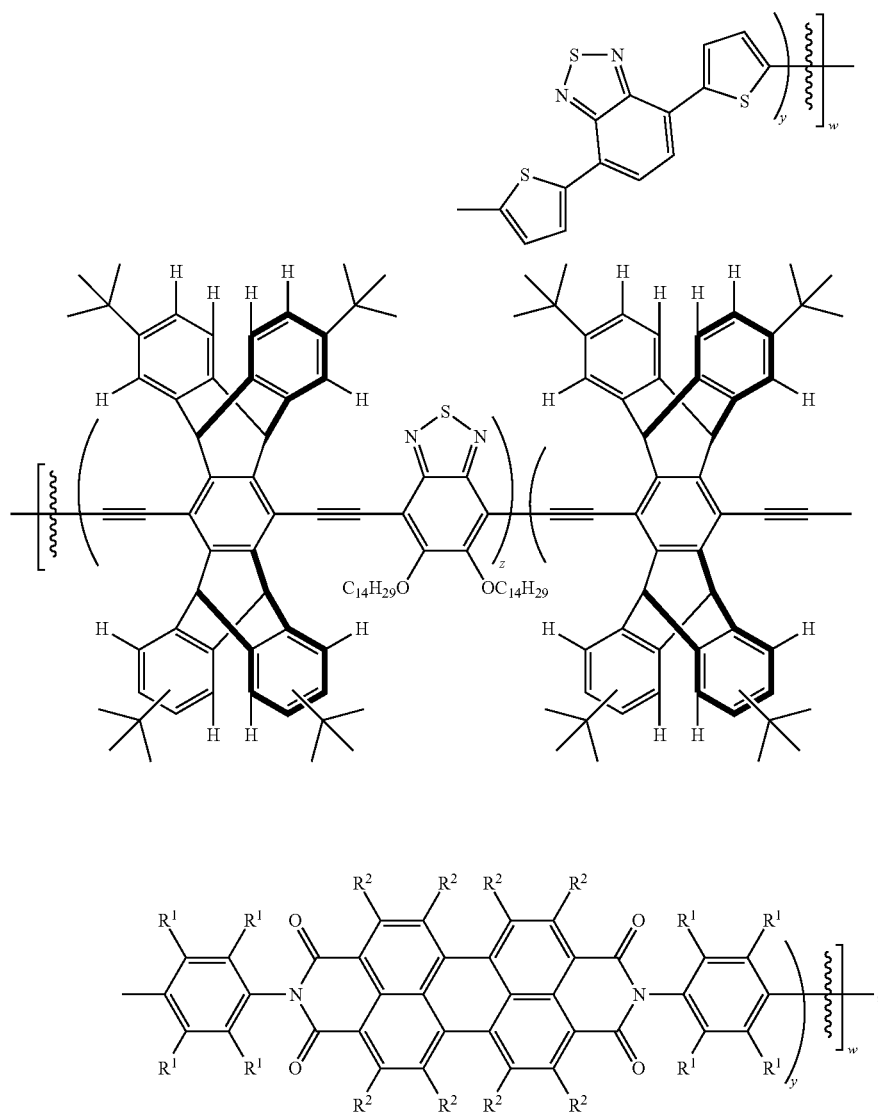
and
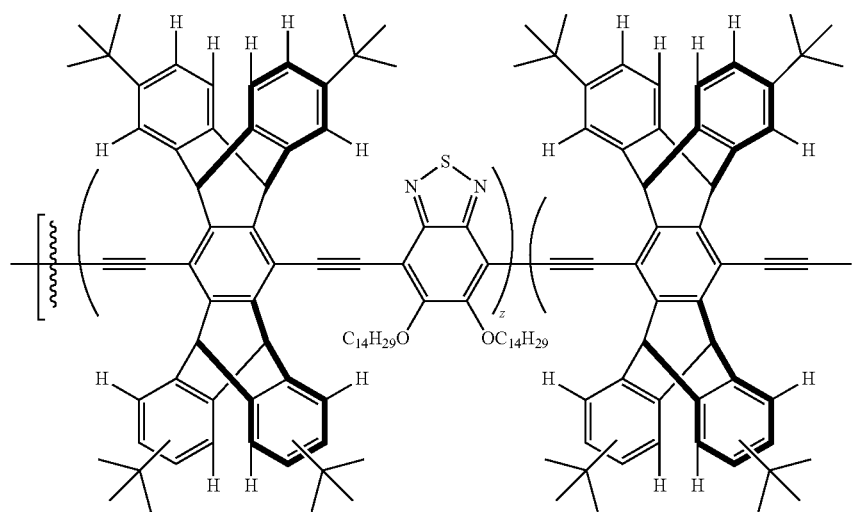

-continued

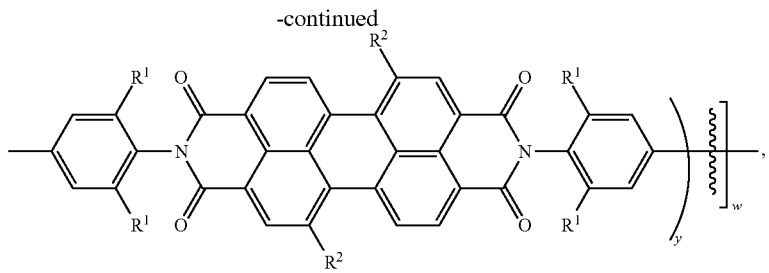

wherein each z is independently 1 or more, each y is independently 0 or more, w is at least 1, and each $R^1$ is the same or different and are independently hydrogen or isopropyl, and each $R^2$ is the same or different and are independently hydrogen or an aryloxy group.

In some embodiments, z may be at least 1, at least 2, at least 5, at least 10, at least 15, at least 20, at least 25, at least 50, at least 100, at least 200, at least 500, or at least 750 times greater than y. In certain embodiments, z may be less than or equal to 1000, less than or equal to 750, less than or equal to 500, less than or equal to 200, less than or equal to 100, less than or equal to 50, less than or equal to 25, less than or equal to 20, less than or equal to 15, less than or equal to 10, less than or equal to 5, or less than or equal to 2times greater than y. Combinations of the above-referenced ranges are also possible (e.g., z is at least 1 times and less than or equal to 1000 times greater than y, z is at least 5 times and less than or equal to 25 times greater than y). Other ranges are also possible.

In some embodiments, the polymer (or co-polymer) has a molecular weight ranging between about 10 kDa and about 200 kDa. For example, in some embodiments, the polymer has a molecular weight of at least about 10 kDa, at least about 20 kDa, at least about 30 kDa, at least about 50 kDa, at least about 100 kDa, or at least about 150 kDa. In certain embodiments, the polymer has a molecular weight of less than or equal to about 200 kDa, less than or equal to about 150 kDa, less than or equal to about 100 kDa, less than or equal to about 50 kDa, less than or equal to about 30 kDa, or less than or equal to about 20 kDa, Combinations of the above referenced ranges are also possible (e.g., between about 10 kDa and about 200 kDa, between about 50 kDa and about 150 kDa).

Figure 2B:
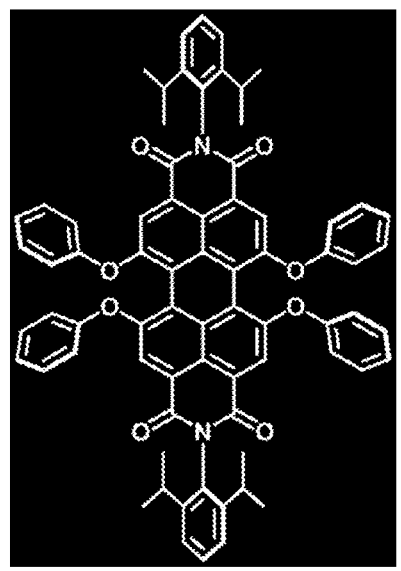
FIG. 2B shows the chemical structures of compounds that may be present in a composition, according to some non-limiting embodiments of the invention.
Figure 2B:
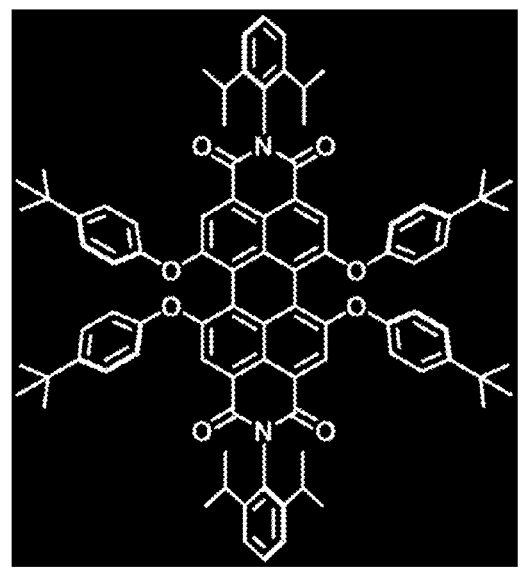

In some embodiments, the composition comprises one or more additives. In certain embodiments, the one or more additives comprise a dye. In some embodiments, the dye is a light-emitting dye. Non-limiting examples of suitable light-emitting dyes include acridine dyes, cyanine dyes, fluorone dyes, oxazine dyes, phenanthridine dyes, rhodamine dyes, perylene dyes, or the like. Those skilled in the art would be capable of selecting suitable light-emitting dyes based upon the teachings of this description. In certain embodiments, the light-emitting dye comprises a perylene bismide (e.g., available from commercial sources such as LUMOGEN®). In some cases, the light-emitting dye may be tert-butylated. FIG. 2B shows non-limiting examples of a perylene bisimide (e.g., Red305) and a tert-butylated perylene bisimide light-emitting dye (e.g., tBuRed305). In some embodiments, the light-emitting dye is a light-emitting polymer (e.g., a conjugated polymer).

In instances where the composition comprises an additive (e.g., a light-emitting dye) and one or more types of polymers (e.g., one or more poly(arylene ethynylene)s), the dye may be present in the composition in an amount ranging between about 0.1 wt % and about 6 wt % versus the total composition. For example, in some embodiments, the dye may be present in the composition in an amount greater than or equal to about 0.1 wt %, greater than or equal to about 0.2 wt %, greater than or equal to about 0.25 wt %, greater than or equal to about 0.3 wt %, greater than or equal to about 0.4 wt %, greater than or equal to about 0.5 wt %, greater than or equal to about 0.75 wt %, greater than or equal to about 1 wt %, greater than or equal to about 1.5 wt %, greater than or equal to about 2 wt %, greater than or equal to about 3 wt %, greater than or equal to about 4 wt %, or greater than or equal to about 5 wt % versus the total composition weight. In some embodiments, the dye may be present in the composition in an amount less than or equal to about 6 wt %, less than or equal to about 5 wt %, less than or equal to about 4 wt %, less than or equal to about 3 wt %, less than or equal to about 2 wt %, less than or equal to about 1.5 wt %, less than or equal to about 1 wt %, less than or equal to about 0.75 wt %, less than or equal to about 0.5 wt %, less than or equal to about 0.4 wt %, less than or equal to about 0.3 wt %, less than or equal to about 0.25 wt %, or less than or equal to about 0.2 wt % versus the total composition weight. Combinations of the above-referenced ranges are also possible (e.g., greater than or equal to about 0.1 wt % and less than or equal to about 6 wt %, greater than or equal to about 0.1 wt % and less than or equal to about 0.5 wt %, greater than or equal to about 0.25 wt % and less than or equal to about 1 wt %, greater than or equal to about 0.5 wt % and less than or equal to about 2 wt %, greater than or equal to about 1 wt % and less than or equal to about 3 wt %, greater than or equal to about 3 wt % and less than or equal to about 6 wt %). Other ranges are also possible.

In some embodiments, in which the light-emitting dye is incorporated into the backbone of a polymer (e.g., a conjugated polymer) as described above (e.g., wherein the polymer comprising a monomer comprising a light-emitting dye), the amount of light-emitting dye present in the backbone of the polymer may range between about 0.1 wt % and about 6 wt % versus the total composition weight (e.g., greater than or equal to about 0.1 wt % and less than or equal to about 6 wt %, greater than or equal to about 0.1 wt % and less than or equal to about 0.5 wt %, greater than or equal to about 0.25 wt % and less than or equal to about 1 wt %, greater than or equal to about 0.5 wt % and less than or equal to about 2 wt %, greater than or equal to about 1 wt % and less than or equal to about 3 wt %, greater than or equal to about 3 wt % and less than or equal to about 6 wt %). Other ranges are also possible.

In certain embodiments, the light-emitting dye is incorporated into the polymer (e.g., the conjugated polymer) as an end-capping group. For example, the polymer (e.g., the conjugated polymer) comprises a structure as in Formula (IV)

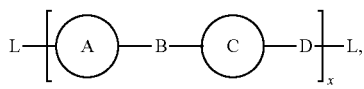

(IV)

wherein x is at least 1 (e.g., between 2 and 10⁶), each A and C are independently optionally substituted aromatic groups, each B and D are independently absent, optionally substituted alkene, alkyne, optionally substituted heteroalkene, or heteroalkyne, and each L is the same or different and an end-capping group comprising a light-emitting dye.

For example, in some embodiments, the composition comprises a polymer with an end-capping group having a structure as in Formula (V):

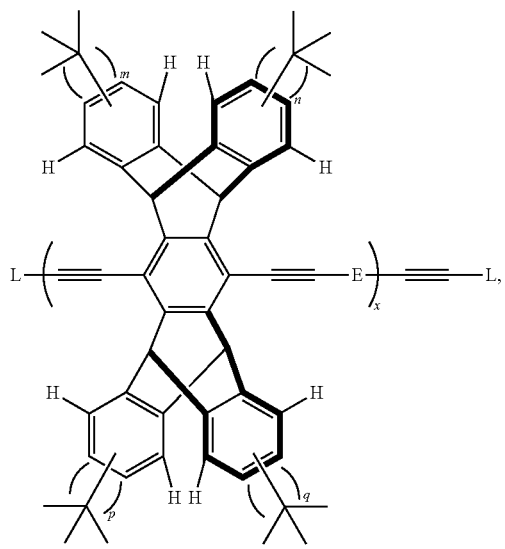

(V)

In some embodiments, L is an end-capping group comprising a light-emitting dye and has a structure as in

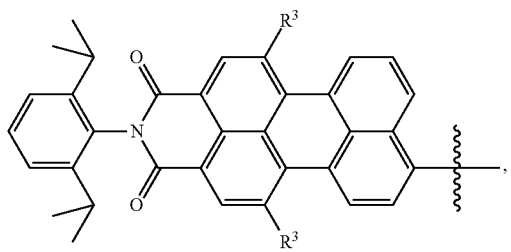

wherein each $R^3$ is the same or different and are independently hydrogen, cyano, halide, hydroxyl, amino, optionally substituted alkoxy, optionally substituted alkyl, optionally substituted heteroalkyl, optionally substituted aryl, optionally substituted heteroaryl, or optionally substituted aryloxy. In some embodiments, each $R^3$ is the same or different and are independently hydrogen or optionally substituted aryloxy. Other end-capping groups comprising a light-emitting dye are also possible. Those skilled in the art would be capable of selecting additional groups suitable for functioning as end-capping group comprising a light-emitting dye based upon the teachings of this specification.

A non-limiting example of a suitable polymer having an end-capping group comprising a light-emitting dye includes,

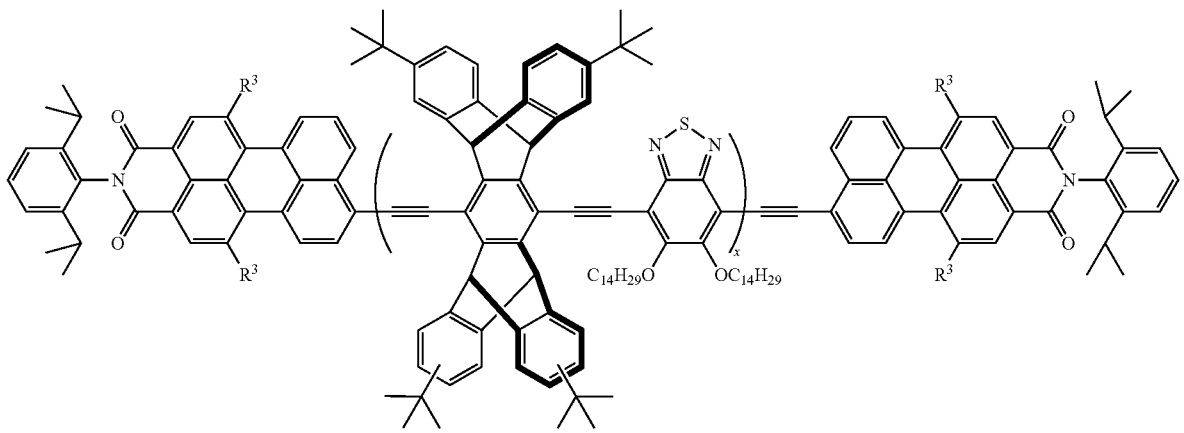

wherein each E is independently an optionally substituted aryl ring system or optionally substituted heteroaryl ring system, each L is independently an end-capping group comprising a light-emitting dye, n, m, p, and q are each independently 0 or 1, and x is at least 1, as described above.

wherein x is at least 1 (e.g., between 2 and 10⁶) and each $R^3$ is the same or different and are independently hydrogen, cyano, halide, hydroxyl, amino, optionally substituted alkoxy, optionally substituted alkyl, optionally substituted heteroalkyl, optionally substituted aryl, optionally substituted heteroaryl, or optionally substituted aryloxy. In some embodiments, each $R^3$ is the same or different and are independently hydrogen or optionally substituted aryloxy.

In some embodiments, the one or more types of polymers make up the remainder of the composition (e.g., present in the composition in an amount ranging between about 94 wt % and about 99.9 wt % versus the total composition). For example, in some embodiments, the one or more types of polymers are present in the composition in an amount greater than or equal to about 94 wt %, greater than or equal to about 95 wt %, greater than or equal to about 96 wt %, greater than or equal to about 97 wt %, greater than or equal to about 98 wt %, greater than or equal to about 99 wt %, greater than or equal to about 99.5 wt %, or greater than or equal to about 99.75 wt % versus the total composition weight. In some embodiments, the one or more types of polymers are present in the composition in an amount less than about 99.9 wt %, less than about 99.5 wt %, less than about 99 wt %, less than about 98 wt %, less than about 97 wt %, less than about 96 wt %, or less than about 95 wt % versus the total composition weight. Combinations of the above-referenced ranges are also possible (e.g., between about 94 wt % and about 99.9 wt %, between about 98 wt % and about 99.9 wt %).

In instances where the composition comprises an additive (e.g., a light-emitting dye), a first type of polymer (e.g., a first type of poly(arylene ethynylene)), and a second type of polymer (e.g., a second type of poly(arylene ethynylene)), the first type of polymer and the second type of polymer may be present in the composition at a weight ratio ranging between about 1:5 and about 5:1. For example, the weight ratio of the first type of polymer and the second type of polymer may be at least about 1:5, at least about 1:4, at least about 1:3, at least about 1:2, at least about 1:1, at least about 2:1, at least about 3:1, or at least about 4:1. Other ranges are also possible. Combinations of the above-referenced ranges are also possible (e.g., between about 1:5 and about 5:1, between about 1:2 and about 2:1). In some embodiments, the weight ratio between the first type of polymer and the second type of polymer is about 1:1.

In some embodiments, the one or more additives comprise a diluent matrix. The diluent matrix may comprise any suitable material. In some embodiments, the diluent matrix comprises a transparent polymer (e.g., a polymer that does substantially absorb visible light). Non-limiting examples of suitable transparent polymers for the diluent matrix include poly(methyl methacrylate) (PMMA), polyethylene, polypropylene, poly(vinyl chloride), poly(vinyl benzoate), poly(vinyl acetate), cellulose, corn starch, poly(vinyl pyrrolidinone)s, polyacrylamides, epoxys, silicones, poly(vinyl butyral)s, polyurethanes, polystyrenes, nylons, polacetals, polycarbonates, polyesters and polyethers, polybutadiene copolymers, crosslinked polymers, combinations thereof, derivatives thereof, and the like. For example, in some embodiments, the diluent matrix comprises PMMA. In certain embodiments, the diluent matrix comprises polycarbonate.

In some embodiments, the diluent matrix is selected such that two or more types of polymers as described herein phase separate into microdomains (e.g., polymer microdomains) within the diluent matrix. The term "microdomain" as used herein refers to a region (e.g., a region within the composition) encompassing one or more types of polymers that are phase separated from the diluent matrix. In some embodiments, the two or more types of polymers may be phase separated from each of the other polymers within the region. In some embodiments, two or more types of polymers are phase separated such that down-conversion/energy transfer cascade (e.g., exciton transfer) may occur between the two or more types of polymers. In some embodiments, an average cross-sectional area of a microdomain may range between about 1 nm and about 1000 microns. Those skilled in the art will be capable of selecting suitable methods for measuring the average cross-section area of the microdomains, including, but not limited to, transmission electron microscopy (TEM), atomic force microscopy (AFM), and X-ray scattering measurements. Without wishing to be bound by theory, the phase separation of microdomains comprising the one or more types of polymers within the diluent matrix offers several advantages over traditional diluent matrix materials (e.g., comprising one or more light-emitting dyes) including the highly efficient energy transfer between the one or more types of polymers (e.g., as a result of the close proximity of the one or more types of polymers with the microdomains), a lower refractive index of the overall composition enabling the formation of expensive optical waveguides, and significant amplification of luminescence by the polymers within the diluent matrix. Refractive index is described in more detail below.

In instances where the composition comprises a diluent matrix, a first type of polymer (e.g., a first type of poly(arylene ethynylene)) and a second type of polymer (e.g., a second type of poly(arylene ethynylene)), the first type of polymer may be present in the composition in an amount ranging between about 0.5 wt % and about 5 wt %, and the second type of polymer may be present in the composition in an amount ranging between about 0.005 wt % and about 1.0 wt % versus the total composition weight. For example, in some such embodiments, the first type of polymer may be present in the composition in an amount greater than or equal to about 0.5 wt %, greater than or equal to about 1 wt %, greater than or equal to about 1.5 wt %, greater than or equal to about 2 wt %, greater than or equal to about 3 wt %, or greater than or equal to about 4 wt % versus the total composition weight. In some embodiments, the first type of polymer may be present in the composition in an amount less than or equal to about 5 wt %, less than or equal to about 4 wt %, less than or equal to about 3 wt %, 2 wt %, less than or equal to about 1.5 wt %, or less than or equal to about 1 wt % versus the total composition weight. Combinations of the above-referenced ranges are also possible (e.g., between about 0.5 wt % and about 5 wt %). In certain embodiments, the second type of polymer may be present in the composition in an amount greater than or equal to about 0.005 wt %, greater than or equal to about 0.01 wt %, greater than or equal to about 0.05 wt %, greater than or equal to about 0.1 wt %, greater than or equal to about 0.2 wt %, greater than or equal to about 0.3 wt %, greater than or equal to about 0.4 wt %, greater than or equal to about 0.5 wt %, greater than or equal to about 0.6 wt %, greater than or equal to about 0.7 wt %, greater than or equal to about 0.8 wt %, or greater than or equal to about 0.9 wt % versus the total composition weight. In some embodiments, the second type of polymer may be present in the composition in an amount less than or equal to about 1 wt %, less than or equal to about 0.9 wt %, less than or equal to about 0.8 wt %, less than or equal to about 0.7 wt %, less than or equal to about 0.6 wt %, less than or equal to about 0.5 wt %, less than or equal to about 0.4 wt %, less than or equal to about 0.3 wt %, less than or equal to about 0.2 wt %, less than or equal to about 0.1 wt %, less than or equal to about 0.05 wt %, or less than or equal to about 0.01 wt % versus the total composition weight. Combinations of the above-referenced ranges are also possible (e.g., between about 0.005 wt % and about 0.5 wt %).

In some embodiments, the diluent matrix may make up the remainder of the composition (e.g., the diluent matrix may be present in the composition in an amount between about 94 wt % and about 99.995 wt % versus the total weight of the composition). For example, in some embodiments, the diluent matrix is present in the composition (e.g., comprising one or more types of polymers and a diluent matrix) in an amount greater than or equal to about 94 wt %, greater than or equal to about 95 wt %, greater than or equal to about 96 wt %, greater than or equal to about 97 wt %, greater than or equal to about 98 wt %, greater than or equal to about 99 wt %, greater than or equal to about 99.5 wt %, greater than or equal to about 99.8 wt % or greater than or equal to about 99.9 wt % versus the total composition weight. In some embodiments, the diluent matrix is present in the composition in an amount less than about 99.995 wt %, less than about 99.9 wt %, less than about 99.8 wt %, less than about 99.5 wt %, less than about 99 wt %, less than about 98 wt %, less than about 97 wt %, less than about 96 wt %, or less than about 95 wt % versus the total composition weight. Combinations of the above-referenced ranges are also possible (e.g., between about 94 wt % and about 99.9 wt %, between about 98 wt % and about 99.9 wt %).

In some embodiments, the two or more types of polymers may have differing properties such as different band gaps. For example, in some embodiments, the composition may comprise a first type of polymer (e.g., a first type of poly(arylene ethynylene)) having a first band gap and a second type of polymer (e.g., a second type of poly(arylene ethynylene)) having a second band gap, wherein the first band gap is greater than the second band gap. In certain embodiments, the one or more additives has a band gap that is less than a band gap of each of the one or more types of polymers. For example, in some embodiments, the one or more additives (e.g., a light-emitting dye, a diluent matrix) has a band gap that is less than the band gap of a first type of polymer and less than the band gap of a second type of polymer.

In instances where the composition comprises a light-emitting dye and a polymer (e.g., a poly(arylene ethynylene)), the light-emitting dye may have a band gap less than the band gap of the polymer. In instances where the composition comprises a light-emitting dye, a first type of polymer (e.g., a first poly(arylene ethynylene)), and a second type of polymer (e.g., a second type of poly(arylene ethynylene)), the light-emitting dye may have a band gap less than the band gap of the first type of polymer and less than the band gap of the second type of polymer. In instances where the composition comprises a diluent matrix, a first type of polymer (e.g., a first type of poly(arylene ethynylene)) and a second type of polymer (e.g., a second type of poly(arylene ethynylene)), the diluent matrix may have a band gap less than the band gap of the first type of polymer and less than the band gap of the second type of polymer.

In some embodiments, the one or more additives comprise a light-emitting dye as described above. For example, in some embodiments, the composition may comprise a first type of polymer (e.g., a first poly(arylene ethynylene)), a second type of polymer (e.g., a second type of poly(arylene ethynylene)) and a light-emitting dye (e.g., a light-emitting polymer comprising a conjugated polymer) different than the first type of polymer and the second type of polymer. In some such embodiments, the light-emitting polymer may have a band gap less than the band gap of the first type of polymer and the band gap of the second type of polymer.

Without wishing to be bound by theory, an additive having a band gap less than the band gaps of each of the one or more types of polymers present in a composition allows for the energy cascade (e.g., exciton transfer) to terminate with the one or more additives before emitting photons (e.g., by the one or more additives) to the substrate.

Figure 3A:
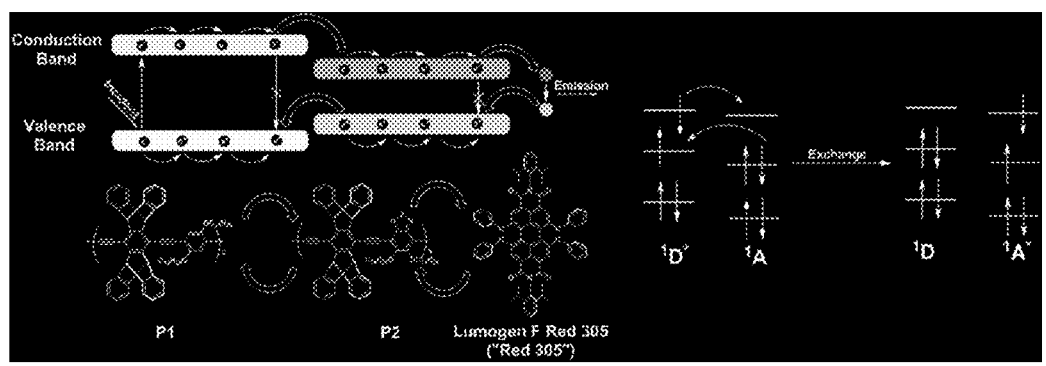
FIG. 3A shows a schematic representation of a band gap and cascade luminescent amplification, according to one embodiment of the invention.
Figure 3B:
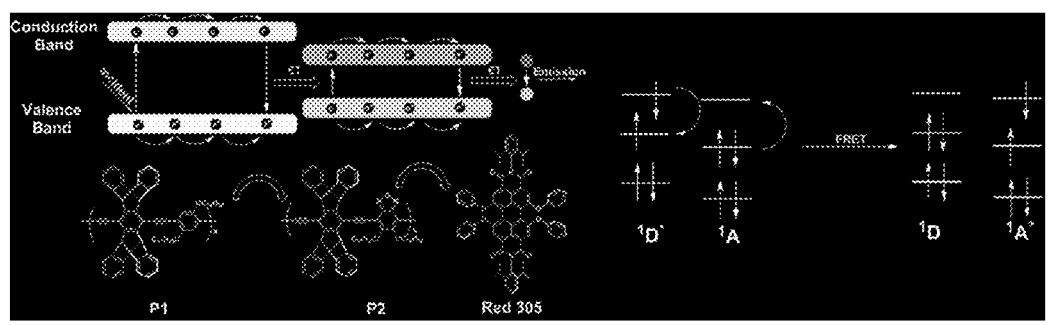
FIG. 3B shows a schematic representation of a band gap and energy transfer cascade, according to one embodiment of the invention.

The term "band gap" (e.g., optical band gap) is known in the art and generally refers to the energy difference (e.g., in electron volts, eV) between the valence band and the conduction band of a material. Without wishing to be bound by theory, a polymer as described herein may have a band gap greater than the band gap of any additional polymers present in the composition and/or the one or more additives present in the composition, such that the polymer absorbs a photon, generating an exciton (e.g., in the pi-conjugated backbone of the polymer). The exciton may, in some cases, migrate along the polymer backbone until encountering a material with a lower band gap (e.g., in an additional polymer present in the composition, in the one or more additives present in the composition), during which thermodynamically favored exciton transfer to the material with the lower band gap occurs. Migration may occur until reaching the material having the lowest band gap in the composition. The material having the lowest band gap (e.g., the one or more additives present in the composition) may then emit electromagnetic radiation (e.g., light) to the substrate. Again, without wishing to be bound by theory, FIG. 3A illustrates an example cascade through which singlet electron exchange (e.g., Dexter) energy transfer occurs due to the high electronic pi-delocalization of the polymers and/or the one or more additives and close proximity of all species in the composition. As illustrated in FIG. 3B, dipole-dipole coupled resonance energy transfer (e.g., Förster) may also play a role in the cascade due to the strong overlap between the emission spectrum of a donor and absorption spectrum of the closest energy acceptor.

In some embodiments, the band gap of each of the one or more types of polymers, or each of the one or more additives, may range between about 0.004 eV and about 0.7 eV. For example, in some cases, the band gap of each of the one or more types of polymers, or each of the one or more additives may be greater than or equal to about 0.004 eV, greater than or equal to about 0.005 eV, greater than or equal to about 0.01 eV, greater than or equal to about 0.02 eV, greater than or equal to about 0.05 eV, greater than or equal to about 0.1 eV, greater than or equal to about 0.2 eV, greater than or equal to about 0.3 eV, greater than or equal to about 0.4 eV, greater than or equal to about 0.5 eV, or greater than or equal to about 0.6 eV. In some embodiments, the band gap of each of the one or more types of polymers, or each of the one or more additives may be less than or equal to about 0.7 eV, less than or equal to about 0.6 eV, less than or equal to about 0.5 eV, less than or equal to about 0.4 eV, less than or equal to about 0.3 eV, less than or equal to about 0.2 eV, less than or equal to about 0.1 eV, less than or equal to about 0.05 eV, less than or equal to about 0.02 eV, less than or equal to about 0.01 eV, or less than or equal to about 0.005 eV. Combinations of the above referenced ranges are also possible (e.g., between about 0.004 eV and about 0.7 eV). Additional ranges are also possible.

In some embodiments, the one or more additives has a band gap that is at least about 5% less than the band gap of each of the one or more types of polymers. For example, in some embodiments, the one or more additives has a band gap that is at least about 5% less, at least about 10% less, at least about 15% less, at least about 20% less, at least about 40% less, at least about 50% less, at least about 70% less, or at least about 80% less than the band gap of each of the one or more types of polymers.

Band gap, as used herein, is measured using fluorescence emission spectra via UV/Visible Light spectrophotometry, unless otherwise specified.

Figure 4A:
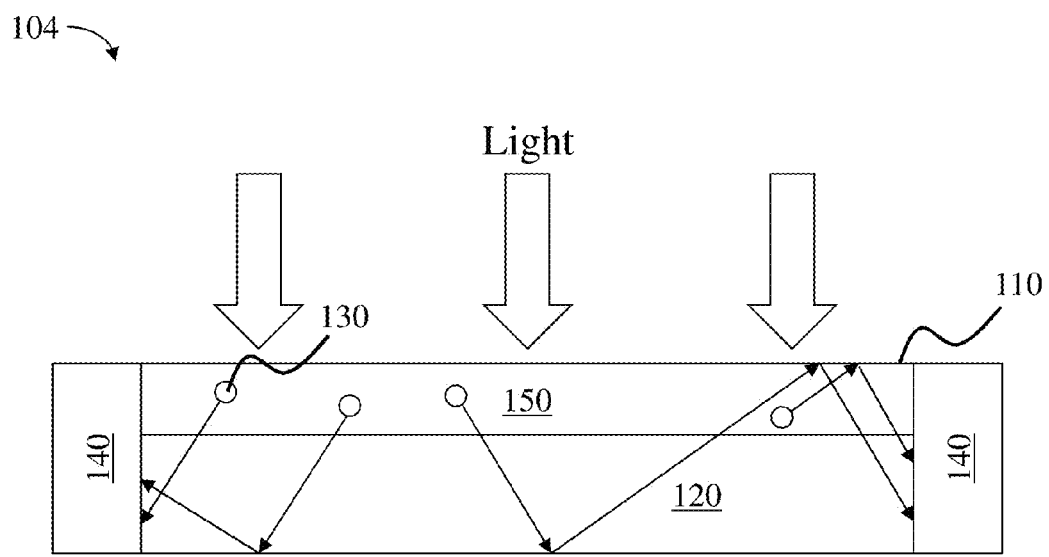
FIG. 4A shows a schematic representation of an article comprising a substrate and a composition comprising one or more types of polymers and an additive, according to some non-limiting embodiments.
Figure 4B:
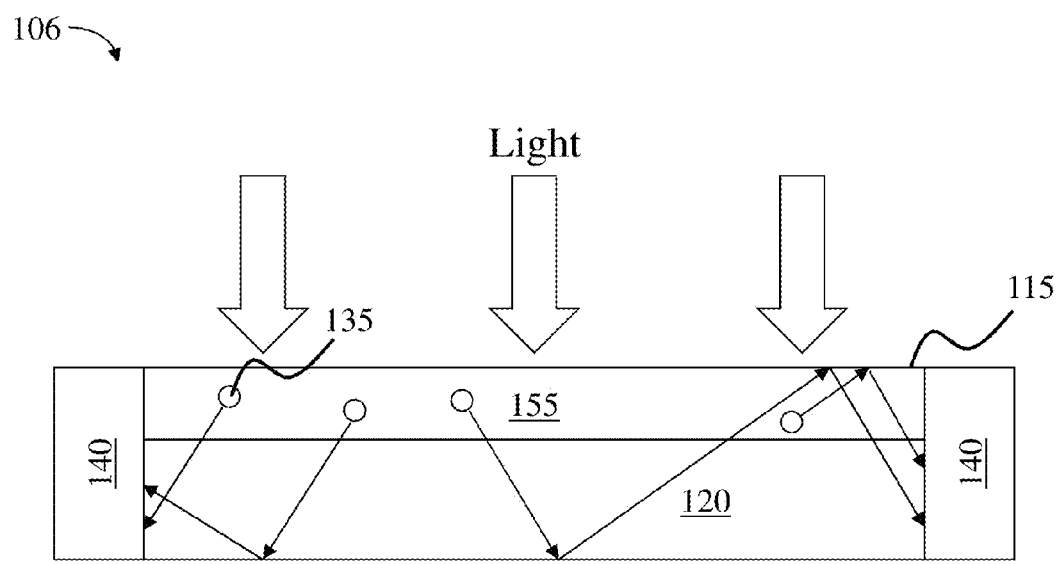
FIG. 4B shows a schematic representation of an article comprising a substrate and a composition comprising one or more types of polymers and an additive, according to some non-limiting embodiments.

In some embodiments, the composition and/or substrate each have a particular refractive index (e.g., for the transmission of light from the composition to the substrate). Methods for determining refractive index are generally known in the art and may include, for example, ellipsometry (e.g., using a variable angle spectroscopy ellipsometer) at a particular incidence angle (e.g., 70°). In some embodiments, the refractive index of the composition is determined in the absence of the one or more additives (e.g., the light-emitting dye, the diluent matrix). Generally, the waveguiding ability of a thin film luminescent solar concentrator may be dependent on the difference between the refractive indices of the thin film (e.g., the composition) and the substrate. That is to say, similar refractive indices may result in improved waveguiding ability. For example, as illustrated in FIG. 4A, light absorbed by device 104 is transmitted (e.g., by absorption by one or more types of polymers and migration and transfer to) to composition 110 comprising one or more additives 130 (e.g., a light-emitting dye) embedded within one or more types of polymers 150. Without wishing to be bound by theory, the one or more additives generally emits photons that are unable to be reabsorbed by the one or more types of polymers present in the composition, and are transferred to substrate 120 and subsequently waveguided to optional photovoltaic components 140. Photovoltaic components are described in more detail, below. In an alternative embodiment, as illustrated in FIG. 4B, light absorbed by device 106 is transmitted (e.g., by absorption by one or more types of polymers and migration and transfer to) to composition 115 comprising one or more polymer microdomains 135 embedded within diluent matrix 155, and photons emitted by the one or more polymer microdomains are subsequently waveguided to optional photovoltaic components 140. The efficient transfer of photons between the composition and the substrate is generally related to refractive indices of the respective materials.

In some embodiments, it may therefore be desirable for the average refractive index of the composition to be similar to the average refractive index of the substrate. In some embodiments, the percent difference in average refractive index of the composition and the average refractive index of the substrate is less than about 15%. The percent difference in average refractive index can be determined by subtracting the greater of the average refractive indices of the composition and the substrate, and dividing the difference by the average refractive index of the substrate. In certain embodiments, the percent difference between the refractive index of the composition and the refractive index of the substrate is less than about 12%, less than about 10%, less than about 8%, less than about 5%, less than about 4%, less than about 2%, or less than about 1%. In some embodiments, the average refractive index of the substrate and the average refractive index of the composition are substantially the same (e.g., a percent difference of about 0%).

In some embodiments, the average refractive index of the composition and/or the substrate may range between about 1.4 and about 1.8. For example, in some embodiments, the average refractive index of the composition and/or the substrate is greater than or equal to about 1.4, greater than or equal to about 1.45, greater than or equal to about 1.5, greater than or equal to about 1.6, or greater than or equal to about 1.7. In certain embodiments, the average refractive index of the composition and/or the substrate is less than about 1.8, less than about 1.7, less than about 1.6, less than about 1.5, or less than about 1.45. Combinations of the above-referenced ranges are also possible (e.g., between about 1.4 and about 1.6, between about 1.6 and about 1.8, between about 1.7 and about 1.8).

The substrate may comprise any suitable material. For example, in some embodiments, the substrate comprises a transparent material through which light can pass. In certain embodiments, the substrate comprises glass. In some embodiments, the substrate comprises a polymer (e.g., a transparent polymer). Those skilled in the art would be capable of selecting suitable substrates based on the teachings of this description. In some embodiments, the substrate is selected based upon certain properties (e.g., refractive index) of the substrate, as described in more detail below.

The composition may be formed on the substrate using any suitable technique. In some embodiments, the composition is formed (e.g., polymerized, spin coated, etc.) directly on the substrate. For example, in some embodiments, the composition may be prepared in solution and spin coated onto the substrate. The materials present in the compositions described herein offer several advantages over traditional materials (e.g., for luminescent solar concentrators) in that the polymers described herein may have high solubility in common organic solvents enabling facile access to uniform thin films with broad absorption in the solar spectrum without compromising the low reabsorbing properties of a terminal emission species.

In certain embodiments, the composition may contact the substrate (e.g., at least a portion of the substrate, substantially an entire surface of the substrate) via formation of a bond, such as an ionic bond, a covalent bond (e.g., carbon-carbon, carbon-oxygen, oxygen-silicon, sulfur-sulfur, phosphorus-nitrogen, carbon-nitrogen, metal-oxygen, or other covalent bonds), a hydrogen bond (e.g., between hydroxyl, amine, carboxyl, thiol, and/or similar functional groups), a dative bond (e.g., complexation or chelation between metal ions and monodentate or multidentate ligands), Van der Waals interactions, and the like. In some embodiments, the association of the composition with the substrate permits the transmission of light through the interface between the composition and the substrate.

As described above, in some embodiments, the composition may be deposited on the substrate as a thin film. In some such embodiments, the thin film may have a thickness of between about 5 nm and about 10 microns. For example, in some embodiments, the thin film has a thickness of greater than or equal to about 5 nm, greater than or equal to about 10 nm, greater than or equal to about 20 nm, greater than or equal to about 50 nm, greater than or equal to about 100 nm, greater than or equal to about 200 nm, greater than or equal to about 500 nm, greater than or equal to about 1 micron, greater than or equal to about 2 microns, or greater than or equal to about 5 microns. In some embodiments, the thin film has a thickness of less than about 10 microns, less than about 5 microns, less than about 2 microns, less than about 1 micron, less than about 500 nm, less than about 200 nm, less than about 100 nm, less than about 50 nm, less than about 20 nm, or less than about 10 nm. Combinations of the above-referenced ranges are also possible (e.g., between about 5 nm and about 20 nm, between about 10 nm and about 100 nm, between about 100 nm and about 1 micron, between about 500 nm and about 10 microns). Other ranges are also possible. As described herein, the thin film may be deposited on at least a portion of the substrate by any suitable method.

In some embodiments, the article (e.g., comprising a composition and a substrate associated with the composition) may a have a particular thickness. For example, in certain embodiments, the thickness of the article ranges between about 1 micron and about 10000 microns. In some embodiments, the thickness of the article is at least about 1 micron, at least about 5 microns, at least about 10 microns, at least about 50 microns, at least about 100 microns, at least about 500 microns, at least about 1000 microns, or at least about 5000 microns. In certain embodiments, the thickness of the article may be less than or equal to about 10000 microns, less than or equal to about 5000 microns, less than or equal to about 1000 microns, less than or equal to about 500 microns, less than or equal to about 100 microns, less than or equal to about 50 microns, less than or equal to about 10, or less than or equal to about 5 microns. Combinations of the above-referenced ranges are also possible (e.g., between about 1 mm and about 10000 mm, between about 1 mm and about 1000 mm). Methods for determining thickness are known in the art and may include, in some cases, profilometry.

In some cases, methods of the invention comprise exposing the articles described herein to electromagnetic radiation (e.g., light). In some embodiments, the electromagnetic radiation has a particular wavelength (e.g., such that the composition absorbs and transfers the light to the substrate, and that a wavelength of light emitted from the composition (e.g., to the substrate) has a wavelength less than the wavelength of light absorbed by the composition). The wavelength of an emission refers to the wavelength at which the peak maximum of the emission occurs in an emission spectrum. The emission may be a particular peak having the largest intensity in an emission spectrum (e.g. a fluorescence spectrum), or, alternatively, the emission may be a peak in an emission spectrum that has at least a defined maximum, but has a smaller intensity relative to other peaks in the emission spectrum.

As used herein, "emission" may be luminescence emission, in which "luminescence" is defined as an emission of ultraviolet or visible radiation. Specific types of luminescence include fluorescence, in which a time interval between absorption and emission of visible radiation ranges from $10^{-12}$ to $10^{-7}$ s, phosphorescence, other types of luminescence, and the like. For example, the emission may be "chemiluminescence," which refers to the emission of radiation due to a chemical reaction, or "electrochemiluminescence," which refers to emission of radiation due to electrochemical reactions. In some cases, the emission may be fluorescence emission.

In some embodiments, a change in luminescence intensity may occur for an emission with substantially no shift in the wavelength of the luminescence (e.g., emission), wherein the intensity of the emission changes but the wavelength remains essentially unchanged. In other embodiments, the change in luminescence intensity may occur for an emission in combination with a shift in the wavelength of the luminescence (e.g., emission). For example, an emission may simultaneously undergo a shift in wavelength in addition to an increase or decrease in luminescence intensity. In another embodiment, the change may comprise two emissions occurring at two different wavelengths, wherein each of the two emissions undergoes a change in luminescence intensity. In some cases, the two emission may undergo changes in luminescence intensity independent of one another. In some cases, the two emissions may undergo changes in luminescence intensity, wherein the two emissions are associated with one another, for example, via an energy transfer mechanism, as described more fully above.

In some embodiments, the average wavelength of light absorbed by the composition is between about 300 nm and about 1200 nm. For example, in some embodiments, the average wavelength of light absorbed by the composition may be greater than or equal to about 300 nm, greater than or equal to about 400 nm, greater than or equal to about 500 nm, greater than or equal to about 600 nm, greater than or equal to about 700 nm, greater than or equal to about 800 nm, greater than or equal to about 900 nm, greater than or equal to about 1000 nm, or greater than or equal to about 1100 nm. In certain embodiments, the average wavelength of light absorbed by the composition may be less than about 1200 nm, less than about 1100 nm, less than about 1000 nm, less than about 900 nm, less than about 800 nm, less than about 700 nm, less than about 600 nm, less than about 500 nm, or less than about 400 nm. Combinations of the above-referenced ranges are also possible (e.g., an average wavelength between about 300 nm and about 1200 nm, between about 400 nm and about 800 nm, between about 600 nm and about 1000 nm, between about 800 nm and about 1200 nm).

In certain embodiments, the percent difference between the average wavelength absorbed by the composition and the average wavelength emitted by the composition is at least about 10%. For example, in some embodiments, the percent difference between the average wavelength absorbed by the composition and the average wavelength emitted by the composition is at least about 5%, at least about 10%, at least about 20%, at least about 50%, at least about 70%, or at least about 90%.

As described above, in some embodiments, the article comprises a substrate, a composition, and, optionally, one or more photovoltaic components. For example, as illustrated in FIG. 4A, article 100 comprises composition 110 associated with substrate 120 and optional photovoltaic components 140. In some such embodiments, the optional photovoltaic components may be associated with the composition and/or the substrate. In some cases, the association of the composition and/or the substrate with the photovoltaic component may permit the transmission of light to the photovoltaic component. Those skilled in the art would be capable of selecting suitable photovoltaic components based upon the teachings of the specification including, but not limited to, inorganic solar cells (e.g., comprising Si, InGaP, GaAs, or the like). The photovoltaic components may be arranged in any suitable manner including direct contact with at least a portion of one or more surfaces of the composition and/or at least a portion of one or more surfaces of the substrate. In some embodiments, the photovoltaic components are attached to at least a portion of one or more surfaces of the composition and/or at least a portion of one or more surfaces of the substrate via an adhesive (e.g., comprising a glue, a resin, or the like).

In some embodiments, it may be desirable for the article to have a particular geometric gain. The geometric gain is generally defined as the ratio of the area of the face of the luminescent solar concentrator (e.g., comprising the composition and the substrate) to the total area of the edges that will be attached to a photovoltaic component. In some embodiments, the geometric gain is at least about 3 (e.g., at least about 3, at least about 4, at least about 5, at least about 6, at least about 7, at least about 8, at least about 9, at least about 10). Without wishing to be bound by theory, the geometric gain is a physical measure of an article's capability to concentrate light (e.g., the higher the geometric gain generally the higher the article's capability to concentrate light). For example, assuming that all four edges in each article will be coupled to a photovoltaic component, the geometric gain may be greater than or equal to about 6.25. Geometric gain can generally be determined by dividing the area of the surface of the composition exposed to light by the total sum of the areas of the surfaces in direct contact with the composition and substrate.

As used herein, the term "substituted" is contemplated to include all permissible substituents of organic compounds, "permissible" being in the context of the chemical rules of valence known to those of ordinary skill in the art. It will be understood that "substituted" also includes that the substitution results in a stable compound, e.g., which does not spontaneously undergo transformation such as by rearrangement, cyclization, elimination, etc. In some cases, "substituted" may generally refer to replacement of a hydrogen with a substituent as described herein. However, "substituted," as used herein, does not encompass replacement and/or alteration of a key functional group by which a molecule is identified, e.g., such that the "substituted" functional group becomes, through substitution, a different functional group. For example, a "substituted phenyl group" must still comprise the phenyl moiety and cannot be modified by substitution, in this definition, to become, e.g., a pyridine ring. In a broad aspect, the permissible substituents include acyclic and cyclic, branched and unbranched, carbocyclic and heterocyclic, aromatic and nonaromatic substituents of organic compounds. Illustrative substituents include, for example, those described herein. The permissible substituents can be one or more and the same or different for appropriate organic compounds. For purposes of this invention, the heteroatoms such as nitrogen may have hydrogen substituents and/or any permissible substituents of organic compounds described herein which satisfy the valencies of the heteroatoms.

Examples of substituents include, but are not limited to, aliphatic, alicyclic, heteroaliphatic, heteroalicyclic, halogen, azide, alkyl, aralkyl, alkenyl, alkynyl, cycloalkyl, hydroxyl, alkoxyl, amino, nitro, sulfhydryl, imino, amido, phosphonate, phosphinate, carbonyl, carboxyl, silyl, ether, alkylthio, heteroalkylthio, heteroarylthio, sulfonyl, sulfonamido, ketone, aldehyde, ester, heterocyclyl, aromatic or heteroaromatic moieties, —$CF_3$, —CN, aryl, aryloxy, perhaloalkoxy, aralkoxy, heteroaryl, heteroaryloxy, heteroarylalkyl, heteroaralkoxy, azido, amino, halide, alkylthio, oxo, acylalkyl, carboxy esters, -carboxamido, acyloxy, aminoalkyl, alkylaminoaryl, alkylaryl, alkylaminoalkyl, alkoxyaryl, arylamino, aralkylamino, alkylsulfonyl, -carboxamidoalkylaryl, -carboxamidoaryl, hydroxyalkyl, haloalkyl, alkylaminoalkylcarboxy-, aminocarboxamidoalkyl-, cyano, alkoxyalkyl, perhaloalkyl, arylalkyloxyalkyl, (e.g., $SO_4(R')_2$), a phosphate (e.g., $PO_4(R')_3$), a silane (e.g., $Si(R')_4$), a urethane (e.g., R'O(CO)NHR'), and the like. Additionally, the substituents may be selected from F, Cl, Br, I, —OH, —$NO_2$, —CN, —NCO, —$CF_3$, —$CH_2CF_3$, —$CHCl_2$, —$CH_2OR_x$, —$CH_2CH_2OR_x$, —$CH_2N(R_x)_2$, —$CH_2SO_2CH_3$, —$C(O)R_x$, —$CO_2(R_x)$, —$CON(R_x)_2$, —$OC(O)R_x$, —$C(O)OC(O)R_x$, —$OCO_2R_x$, —$OCON(R_x)_2$, —$N(R_x)_2$, —$S(O)_2R_x$, —$OCO_2R_x$, —$NR_x(CO)R_x$, —$NR_x(CO)N(R_x)_2$, wherein each occurrence of $R_x$ independently includes, but is not limited to, H, aliphatic, alicyclic, heteroaliphatic, heteroalicyclic, aryl, heteroaryl, alkylaryl, or alkylheteroaryl, wherein any of the aliphatic, alicyclic, heteroaliphatic, heteroalicyclic, alkylaryl, or alkylheteroaryl substituents described above and herein may be substituted or unsubstituted, branched or unbranched, cyclic or acyclic, and wherein any of the aryl or heteroaryl substituents described above and herein may be substituted or unsubstituted.

In general, the term "aliphatic," as used herein, includes both saturated and unsaturated, straight chain (i.e., unbranched) or branched aliphatic hydrocarbons, which are optionally substituted with one or more functional groups, as defined below. As will be appreciated by one of ordinary skill in the art, "aliphatic" is intended herein to include, but is not limited to, alkyl, alkenyl, alkynyl moieties. Illustrative aliphatic groups thus include, but are not limited to, for example, methyl, ethyl, n-propyl, isopropyl, allyl, n-butyl, sec-butyl, isobutyl, tert-butyl, n-pentyl, sec-pentyl, isopentyl, tert-pentyl, n-hexyl, sec-hexyl, moieties and the like, which again, may bear one or more substituents, as previously defined.

As used herein, the term "alkyl" is given its ordinary meaning in the art and may include saturated aliphatic groups, including straight-chain alkyl groups, branched-chain alkyl groups, cycloalkyl (alicyclic) groups, alkyl substituted cycloalkyl groups, and cycloalkyl substituted alkyl groups. An analogous convention applies to other generic terms such as "alkenyl," "alkynyl," and the like. Furthermore, as used herein, the terms "alkyl," "alkenyl," "alkynyl," and the like encompass both substituted and unsubstituted groups.

In some embodiments, a straight chain or branched chain alkyl may have 30 or fewer carbon atoms in its backbone, and, in some cases, 20 or fewer. In some embodiments, a straight chain or branched chain alkyl has 12 or fewer carbon atoms in its backbone (e.g., $C_1$-$C_{12}$ for straight chain, $C_3$-$C_{12}$ for branched chain), has 6 or fewer, or has 4 or fewer. Likewise, cycloalkyls have from 3-10 carbon atoms in their ring structure or from 5, 6 or 7 carbons in the ring structure. Examples of alkyl groups include, but are not limited to, methyl, ethyl, propyl, isopropyl, cyclopropyl, butyl, isobutyl, tert-butyl, cyclobutyl, hexyl, cyclohexyl, and the like. In some cases, the alkyl group might not be cyclic. Examples of non-cyclic alkyl include, but are not limited to, methyl, ethyl, propyl, isopropyl, n-butyl, tert-butyl, n-pentyl, neopentyl, n-hexyl, n-heptyl, n-octyl, n-decyl, n-undecyl, and dodecyl.

"Heteroalkyl" groups are alkyl groups wherein at least one atom is a heteroatom (e.g., oxygen, sulfur, nitrogen, phosphorus, etc.), with the remainder of the atoms being carbon atoms. Examples of heteroalkyl groups include, but are not limited to, alkoxy, poly(ethylene glycol)-, alkyl-substituted amino, tetrahydrofuranyl, piperidinyl, morpholinyl, etc.

The terms "alkenyl" and "alkynyl" refer to unsaturated aliphatic groups analogous in length and possible substitution to the alkyls described above, but that contain at least one double or triple bond respectively. Alkenyl groups include, but are not limited to, for example, ethenyl, propenyl, butenyl, 1-methyl-2-buten-1-yl, and the like. Non-limiting examples of alkynyl groups include ethynyl, 2-propynyl (propargyl), 1-propynyl, and the like.

The terms "heteroalkenyl" and "heteroalkynyl" refer to unsaturated aliphatic groups analogous in length and possible substitution to the heteroalkyls described above, but that contain at least one double or triple bond respectively.

As used herein, the term "halogen" or "halide" designates —F, —Cl, —Br, or —I.

The term "aryl" refers to aromatic carbocyclic groups, optionally substituted, having a single ring (e.g., phenyl), multiple rings (e.g., biphenyl), or multiple fused rings in which at least one is aromatic (e.g., 1,2,3,4-tetrahydronaphthyl, naphthyl, anthryl, or phenanthryl). That is, at least one ring may have a conjugated Pi electron system, while other, adjoining rings can be cycloalkyls, cycloalkenyls, cycloalkynyls, aryls, and/or heterocycyls. The aryl group may be optionally substituted, as described herein. "Carbocyclic aryl groups" refer to aryl groups wherein the ring atoms on the aromatic ring are carbon atoms. Carbocyclic aryl groups include monocyclic carbocyclic aryl groups and polycyclic or fused compounds (e.g., two or more adjacent ring atoms are common to two adjoining rings) such as naphthyl group. Non-limiting examples of aryl groups include phenyl, naphthyl, tetrahydronaphthyl, indanyl, indenyl and the like.

The terms "heteroaryl" refers to aryl groups comprising at least one heteroatom as a ring atom, such as a heterocycle. Non-limiting examples of heteroaryl groups include pyridyl, pyrazinyl, pyrimidinyl, pyrrolyl, pyrazolyl, imidazolyl, thiazolyl, oxazolyl, isooxazolyl, thiadiazolyl, oxadiazolyl, thiophenyl, furanyl, quinolinyl, isoquinolinyl, and the like.

The term "aryloxy" is given its ordinary meaning in the art and refers to aromatic carbocyclic groups, optionally substituted, having a single ring (e.g., phenyl), multiple rings (e.g., biphenyl), or multiple fused rings in which at least one is aromatic (e.g., 1,2,3,4-tetrahydronaphthyl, naphthyl, anthryl, or phenanthryl) bonded to an oxygen, such as a phenoxy group.

It will also be appreciated that aryl and heteroaryl moieties, as defined herein, may be attached via an aliphatic, alicyclic, heteroaliphatic, heteroalicyclic, alkyl or heteroalkyl moiety and thus also include -(aliphatic)aryl, -(heteroaliphatic)aryl, -(aliphatic)heteroaryl, -(heteroaliphatic) heteroaryl, -(alkyl)aryl, -(heteroalkyl)aryl, -(heteroalkyl) aryl, and -(heteroalkyl)-heteroaryl moieties. Thus, as used herein, the phrases "aryl or heteroaryl" and "aryl, heteroaryl, (aliphatic)aryl, -(heteroaliphatic)aryl, -(aliphatic)heteroaryl, -(heteroaliphatic)heteroaryl, -(alkyl)aryl, -(heteroalkyl)aryl, -(heteroalkyl)aryl, and -(heteroalkyl)heteroaryl" are interchangeable.

The term "arylalkyl," as used herein, refers to a group comprising an aryl group attached to the parent molecular moiety through an alkyl group.

The term "arylheteroalkyl," as used herein, refers to a group comprising an aryl group attached to the parent molecular moiety through a heteroalkyl group.

The term "heteroarylalkyl," as used herein, refers to a group comprising a heteroaryl group attached to the parent molecular moiety through an alkyl group.

The following examples illustrate embodiments of certain aspects of the invention.

EXAMPLE 1

The following examples demonstrates the fabrication of non-limiting articles, according to some embodiments.

The polymers were synthesized according to the following general procedures.

Prior to use, N,N-diisopropylamine was distilled over KOH and sparged under argon for 2 hours. Toluene was passed through a solvent purification system using columns of activated alumina, stored over 3 Å molecular sieves, and sparged under argon for 2 hours. All other solvents were used without additional purification. Lumogen® F Red305 (Red305) was obtained from BASF. Tetrakis(triphenylphosphine)palladium(0), tris(dibenzylideneacetone)dipalladium (0), copper (I) iodide, tri(p-tolyl)phosphine, [bis(trifluoroacetoxy)iodo]benzene, iodine, potassium carbonate, and poly(methyl methacrylate) (PMMA) were all obtained from Sigma Aldrich. 4-tert-butylphenol was obtained from Avocado Research Chemicals Ltd. 25 mm×25 mm×1 mm soda-lime glass substrates were cut from plain microscope slides (VWR VistaVision).

Synthesis of 4,7-Diiodo-5,6-bis(tetradecyloxy) benzo-2,1,3-thiadiazole (5)

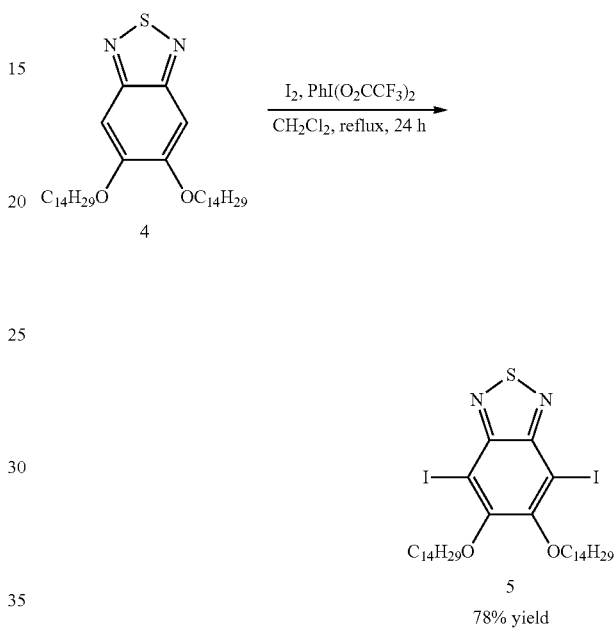

To a 300 mL round-bottom flask equipped with a magnetic stir bar was added 5,6-bis(tetradecyloxy)benzo-2,1,3-thiadiazole (2.50 g, 4.46 mmol), iodine (1.36 g, 5.35 mmol), [bis(trifluoroacetoxy)iodo]benzene (2.30 g, 5.35 mmol), and 150 mL dichloromethane. A reflux condenser was subsequently attached to the flask and contents were heated to reflux and stirred for 24 hours. The reaction mixture was cooled to room temperature and washed with 2×100 mL 20% aqueous sodium thiosulfate solution, 2×100 mL 20% aqueous sodium bicarbonate solution, and 2×100 mL saturated aqueous sodium chloride solution. The organic layer was dried with anhydrous $MgSO_4$ and filtered through a short plug of silica gel with dichloromethane as the eluent. The solvent was evaporated under reduced pressure and the resulting residue was recrystallized from isopropanol to furnish (5) as a white solid (2.83 g, 78%). $R_f$=0.46 ($SiO_2$ TLC, 1:1 $CHCl_3$:Hexanes). m.p. 81° C.-82° C. $^1H$ NMR (400 MHz, $CDCl_3$): δ (ppm)=4.12 (t, 4H), 1.91 (m, 4H), 1.54 (m, 4H), 1.26 (br. m, 40H) 0.88 (t, 6H) $^{13}C$ NMR (100 MHz, $CDCl_3$): δ (ppm)=157.2, 151.9, 82.8, 75.1, 32.1, 30.5, 29.9 (br.), 29.8 (br.), 26.3, 22.8, 14.3. HRMS (DART) calculated for $C_{34}H_{58}I_2N_2O_2S$ $[M+H]^+$: 813.2381, found: 813.2367.

Synthesis of Conjugated Polymer P2

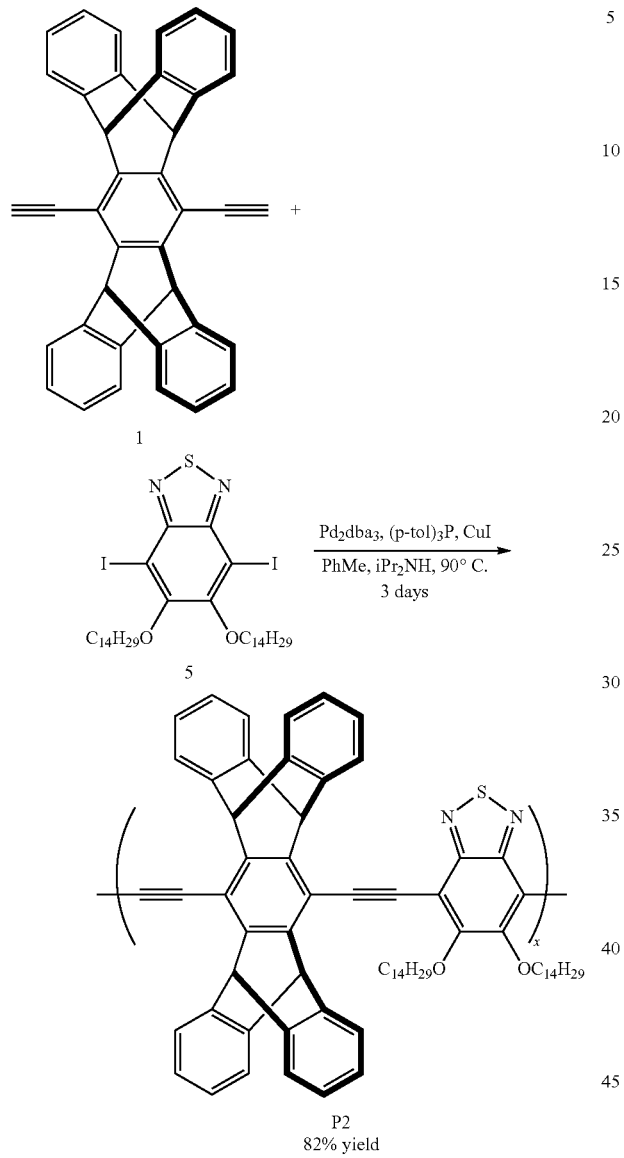

P2
82% yield

To a 50 mL Schlenk flask equipped with a magnetic stir bar was added 1.00 g (2.09 mmol) pentiptycene dialkyne 1, 1.70 g (2.09 mmol) 4,7-diiodo-5,6-bis(tetradecyloxy)benzo-2,1,3-thiadiazole (5), 47.83 mg (52.2 µmol) $Pd_2(dba)_3$, 63.60 mg (209 µmol) $P(p\text{-tol})_3$, and 19.90 mg (104 µmol) CuI. Following 5 vacuum-argon backfill cycles, 18 mL anhydrous degassed toluene and 6 mL anhydrous degassed N,N-diisopropylamine were added. The reaction mixture was stirred at 90° C. for three days under a flow of argon. Upon completion, the reaction mixture was added dropwise to 300 mL of rapidly stirring methanol. The resulting orange precipitate was stirred in 300 mL boiling acetone for 10 minutes, followed by 150 mL hexanes for 30 minutes. The solid was filtered and dried to furnish 1.83 g (82% yield) P2 as an orange solid. $^1$H NMR (400 MHz, CDCl$_3$): δ (ppm)=7.63 (br. s., 8H), 7.10 (br. s., 8H), 6.53 (br. s., 4H), 4.93 (br. s., 4H) 2.40 (br. s., 4H), 1.87 (br. s., 4H), 1.58 (br. s., 4H), 1.28 (br. s., 40H), 0.93 (br. t., 6H). $^{13}$C NMR (100 MHz, CDCl$_3$): δ (ppm)=157.3, 153.1, 145.0, 125.5, 124.2, 115.5, 108.7, 97.9, 90.7, 75.7, 52.3, 30.0-29.9 (br.), 29.5, 26.6, 19.3, 14.2. GPC (THF): $M_n$=22 kDa, $M_w$=27 kDa, PDI=1.7.

Synthesis of Conjugated Polymer P3

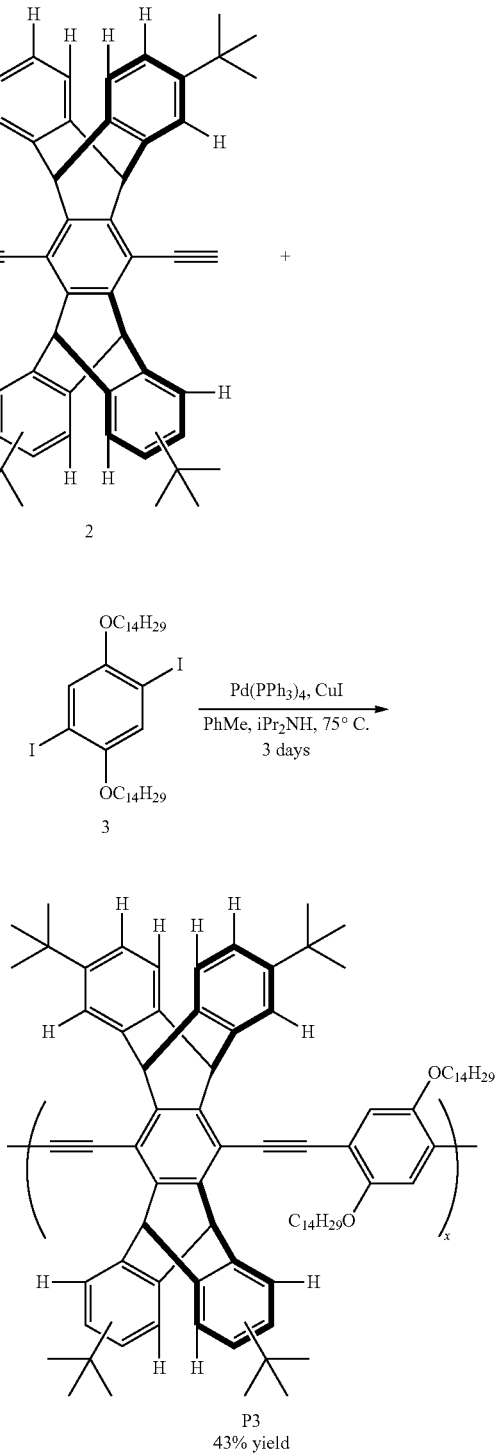

P3
43% yield

To a 50 mL Schlenk flask equipped with a magnetic stir bar was added 0.400 g (0.569 mmol) pentiptycene dialkyne (2), 0.429 g (0.569 mmol) 1,4-diiodo-2,5-bis(tetradecyloxy)benzene (3), 32.9 mg (28.5 μmol) Pd(PPh$_3$)$_4$, and 5.42 mg (28.5 μmol) CuI. After degassing the flask with 4 vacuum-argon backfill cycles, 15 mL of degassed toluene and 6 mL of degassed N,N-diisopropylamine were added. The reaction mixture was stirred under argon at 75° C. for 3 days, which was then cooled to room temperature and added dropwise to the vortex of 300 mL of rapidly stirring methanol. The resulting precipitate was filtered, dissolved in chloroform, and passed through a short plug of silica gel using chloroform as the eluent. The collected fraction was concentrated in vacuo to approximately 10-15 mL and the polymer was reprecipitated in another 300 mL stirring methanol. The polymer was filtered and washed with excess n-pentane to yield 301 mg (43% yield) of P3 as a brilliant yellow solid. $^1$H NMR (400 MHz, CDCl$_3$): δ (ppm)=7.52 (br. s., 6H), 7.42 (br. s., 4H), 7.07 (br. s., 4H), 6.04 (br. s., 4H), 4.50 (br. s., 4H), 2.26 (br. s., 4H), 1.74 (br. s., 4H), 1.53 (br. s., 4H), 1.32-1.17 (br. m, 76H), 0.90 (br. t., 6H). $^{13}$C NMR (100 MHz, CDCl$_3$): δ (ppm)=154.0, 148.3, 145.4, 144.5, 142.5, 123.4, 121.9, 118.0, 115.2, 93.6, 91.5, 70.4, 52.4, 34.8, 32.1, 31.8, 30.1, 29.8, 29.5, 26.5, 22.9, 14.3. GPC (THF): M$_n$=50 kDa, M$_w$=102 kDa, PDI=2.1.

Synthesis of Conjugated Polymer P4

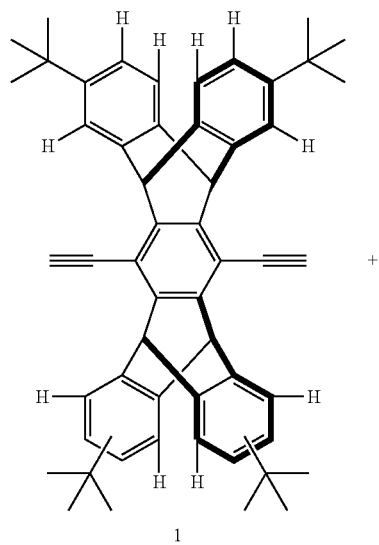

1

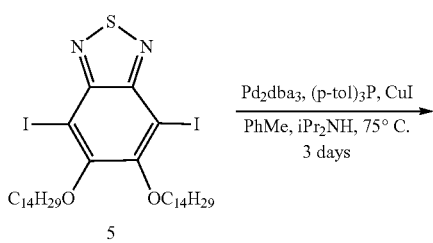

5

Pd$_2$dba$_3$, (p-tol)$_3$P, CuI
PhMe, iPr$_2$NH, 75° C.
3 days

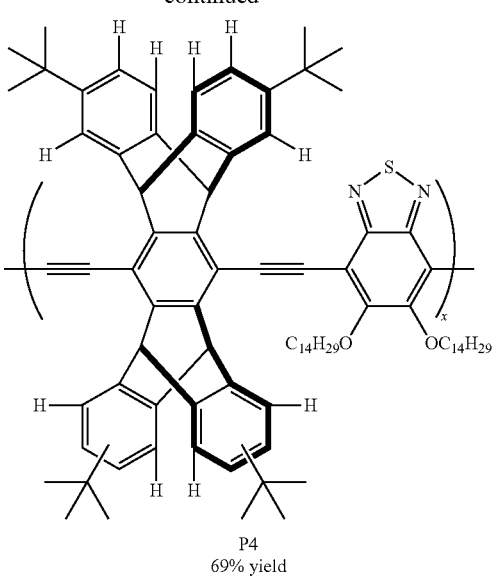

P4
69% yield

To a 50 mL Schlenk flask equipped with a magnetic stir bar was added 0.500 g (0.711 mmol) pentiptycene dialkyne 2, 0.578 g (0.711 mmol) 4,7-diiodo-5,6-bis(tetradecyloxy)benzo-2,1,3-thiadiazole (5), 16.28 mg (17.8 μmol) Pd$_2$(dba)$_3$, 21.65 mg (71.1 μmol) P(p-tol)$_3$, and 6.77 mg (35.6 μmol) CuI. Following 4 vacuum-argon backfill cycles, 18 mL anhydrous degassed toluene and 6 mL anhydrous degassed N,N-diisopropylamine were added. The resulting suspension was stirred under argon at room temperature for 20 minutes and then at 75° C. for 3 days. The reaction mixture was cooled to room temperature and added dropwise to the vortex of 300 mL rapidly stirring methanol. The precipitated polymer P4 was filtered, dissolved in chloroform, and passed through a plug of silica gel with chloroform as the eluent. The fraction was concentrated to about 10 mL and the product was reprecipitated in 300 mL rapidly stirring methanol. The collected solid was then stirred in 250 mL of hot acetone to remover lower molecular weight oligomers. The polymer was finally filtered and washed with an additional 20 mL of room-temperature acetone to furnish 630 mg (69% yield) of P4 as an orange solid. $^1$H NMR (400 MHz, CDCl$_3$): δ (ppm)=7.65 (br. s., 4H), 7.49 (br. s., 4H), 7.09 (br. s., 4H), 6.37 (br. s., 4H), 4.95 (br. s., 4H), 2.37 (br. s., 4H), 1.85 (br. s., 4H), 1.53 (br. s., 4H), 1.33-1.24 (br. m., 76H), 0.90 (br. t., 4H). $^{13}$C NMR (100 MHz, CDCl$_3$): δ (ppm)=157.2, 153.3, 145.4, 145.2, 142.6, 123.5, 122.1, 121.5, 115.3, 108.6, 98.3, 90.4, 75.6, 52.2, 32.1, 31.4, 30.1-29.9 (br.), 29.6, 22.9, 14.3.

Synthesis of tBuRed305

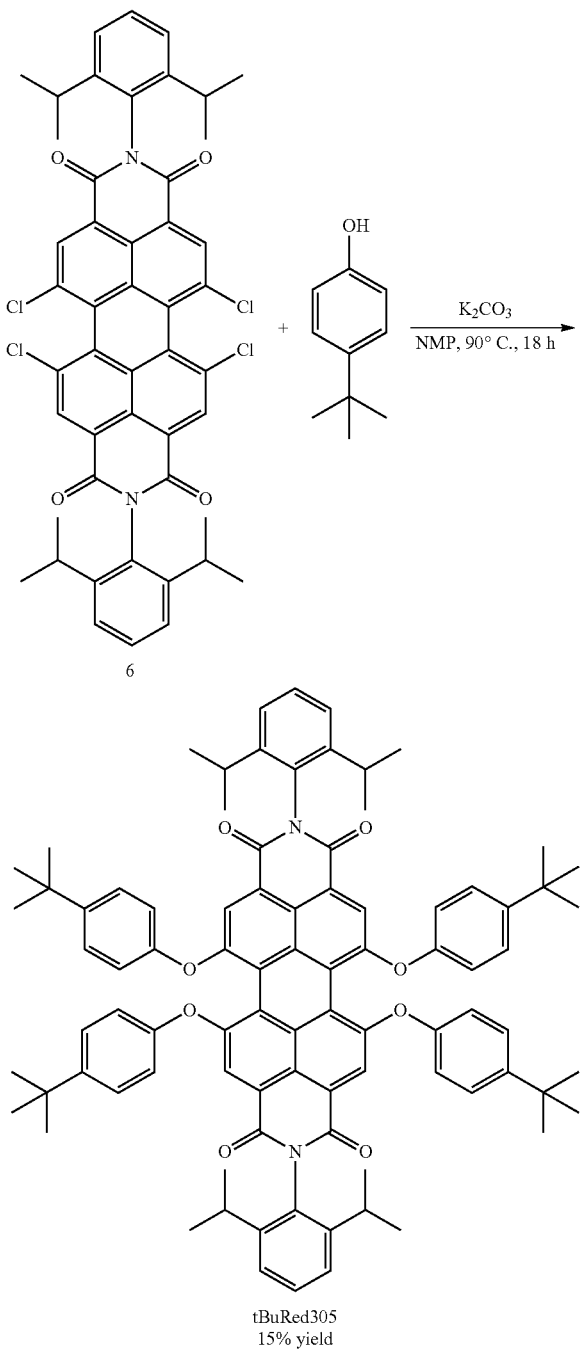

tBuRed305
15% yield

To a 50 mL 2-neck round bottom flask equipped with a magnetic stir bar was added 0.50 g (0.59 mmol) (6), 0.89 g (5.9 mmol) 4-tert-butylphenol, 0.61 g (4.42 mmol) $K_2CO_3$, and 14 mL N-methyl-2-pyrrolidone (NMP). The mixture was placed under a flow of argon and stirred at 90° C. for 18 h. The reaction mixture was then cooled to room temperature and poured into 100 mL of 10% HCl. The resulting precipitate was filtered and subjected to $SiO_2$ column chromatography twice (80/20 $CH_2Cl_2$, then 1:1 $CHCl_3$:Hexanes) to furnish analytically pure tBuRed305 as a red powder (0.12 g, 16% yield). $^1H$ NMR (400 MHz, $CDCl_3$): δ (ppm)=8.29 (s, 4H), 7.42 (t, 2H) 7.24-7.28 (m, 12H), 6.87 (d, 8H), 2.71 (m, 4H), 1.28 (s, 36H), 1.13 (d, 24H HRMS (ESI) calculated for $C_{88}H_{90}N_2O_8$ $[M+H]^+$: 1303.6770. found: 1303.6795.

Thin film luminescent solar concentrators (LSCs) were fabricated according to the following general procedures.

LSC Containing P2 and Red305:

0.5 mL of a 1 mg/10 mg solution of Red305 in chloroform was added to 20 mg of P2. The resulting suspension was diluted with 0.4 mL more chloroform and dissolved. The top of a 25 mm×25 mm×1 mm glass substrate previously sonicated in acetone was covered by the solution and the sample was then spin-coated (instrument) at 2500 rpm for 45 seconds.

LSC Containing P1, P2, and Red305:

0.6 mL of the stock 1 mg/10 mg solution of Red305 in chloroform was added to 12 mg of P1 and 12 mg of P2 and diluted with 0.4 mL chloroform. The solution was treated using the described procedure above to produce the dual poly(arylene ethynylene)-amplifying LSC.

Thin Film of P3, P4, and Red305:

0.2 mL of a 1 mg/10 mg solution of tBuRed305 in chloroform was added to 2 mg of P3 and 2 mg of P4. The resulting solution was coated on a small rectangular glass substrate and spin-coated at 1500 rpm.

Thin Film of P1 and P2 in PMMA:

125 mg of PMMA was dissolved in 1-2 mL of chloroform. To this solution was added 1.25 mg P1 and 0.125 mg P2. The resulting solution was spin coated on a small rectangular glass substrate at 2000 rpm.

Film Thicknesses

Ellipsometry data were acquired at an incidence angle of 70°. Samples were coated on a silicon substrate of height 525 μm and a native $SiO_2$ layer of 4 nm as determined by the ellipsometer. A 20 mg sample of P1 in 1 mL chloroform was spin coated on the silicon substrate at 2500 rpm for 45 seconds and determined to have an average film thickness of 177±1 nm by profilometry. A sample of 13 mg P1 and 13 mg P2 was dissolved in 1 mL chloroform and spin-coated on the silicon square at 2500 rpm for 30 seconds. The average film thickness of this blend was 416±3 nm.

Band Gap

P5 (FIG. 2A) was determined to have a lower bandgap than P3 or P4 which may be due to the presence of the bis-thienylbenzo[2,1,3]thiadiazole moiety in the repeat unit.

EXAMPLE 2

The following examples describe measurements and characterizations of compositions and articles described in Example 1.

To demonstrate the schemes illustrated in FIG. 3A for a single polymer system, a combination of P2 and 0.25 wt % Red305 was dissolved in chloroform and spin-coated onto a square soda-lime glass substrate (25 mm×25 mm×1 mm) to produce a uniform and transparent film, as described above. In addition, a 1:1 mass ratio of both polymers and 0.25 wt % Red305 was coated to produce the dual polymer LSC.

Figure 5A:
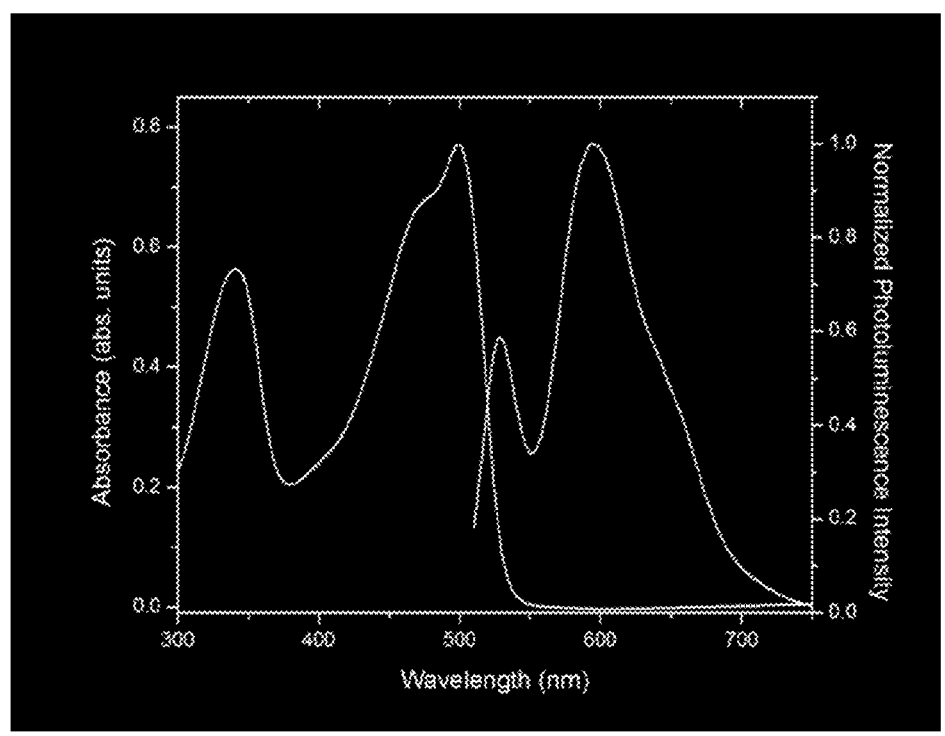
FIGS. 5A-B show the absorption and photoluminescence spectra for a thin film luminescent solar concentrator comprising a non-limiting polymer and a light-emitting dye, acquired at various configurations (excitation wavelength $\lambda ex$=490 nm).
Figure 5B:
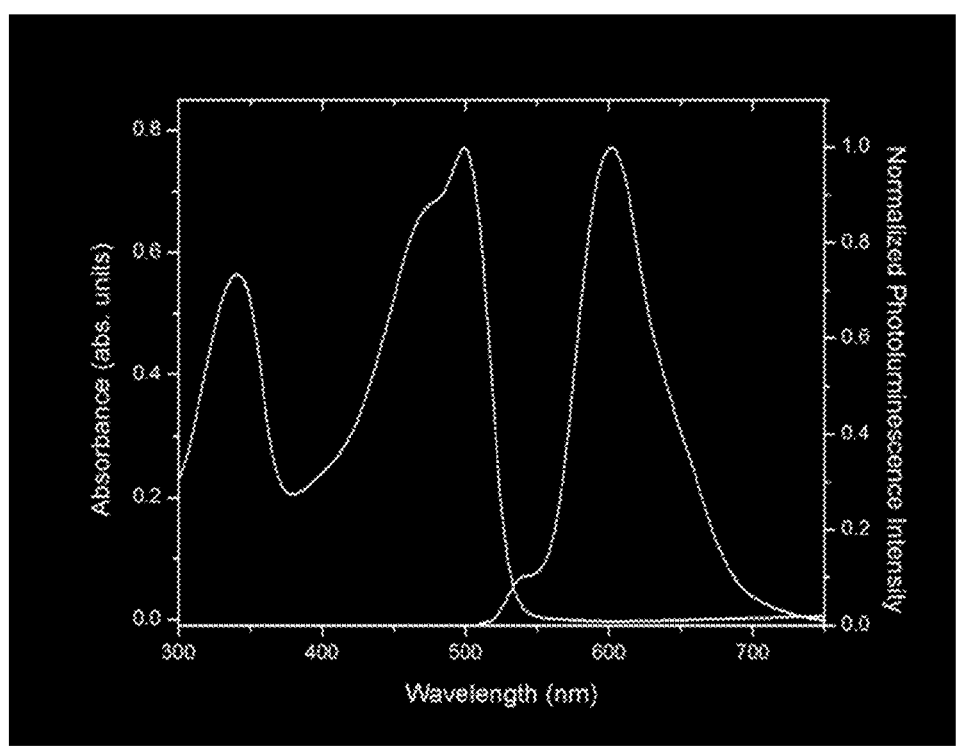

The absorption and emission spectra of the fabricated thin film LSC containing P2 and 0.25 wt % Red305 are shown in FIGS. 5A and 5B. The outer absorption band at λ=500 nm coincides with the peak maximum intensity of the AM 1.5G spectrum and thus demonstrates P2's potential as an efficient solar absorber. Past λ=540 nm, an extremely small trace originating from the absorption of Red305 was observed with a relative magnitude comparable to those of minority emitters recently employed in efficient low reabsorbing quantum dot-based LSCs. Two sets of photoluminescence spectra presented feature the emission profile acquired by placing the center of the LSC in front of the excitation beam of a fluorimeter and orienting the detector in a front-face configuration (FIG. 5A) photoluminescence of the blend across a very small distance and at a right angle (FIG. 5B) to detect the edge emission. Comparison of each set demonstrated the effect of reabsorption on the residual emission of P2 that strongly overlaps with the major absorption band en route to the edges of the LSC. The emission of Red305 was largely preserved, with a slight 5 nm redshift in the emission maximum indicative of very minor reabsorption by the small amounts of dye.

Figure 6A:
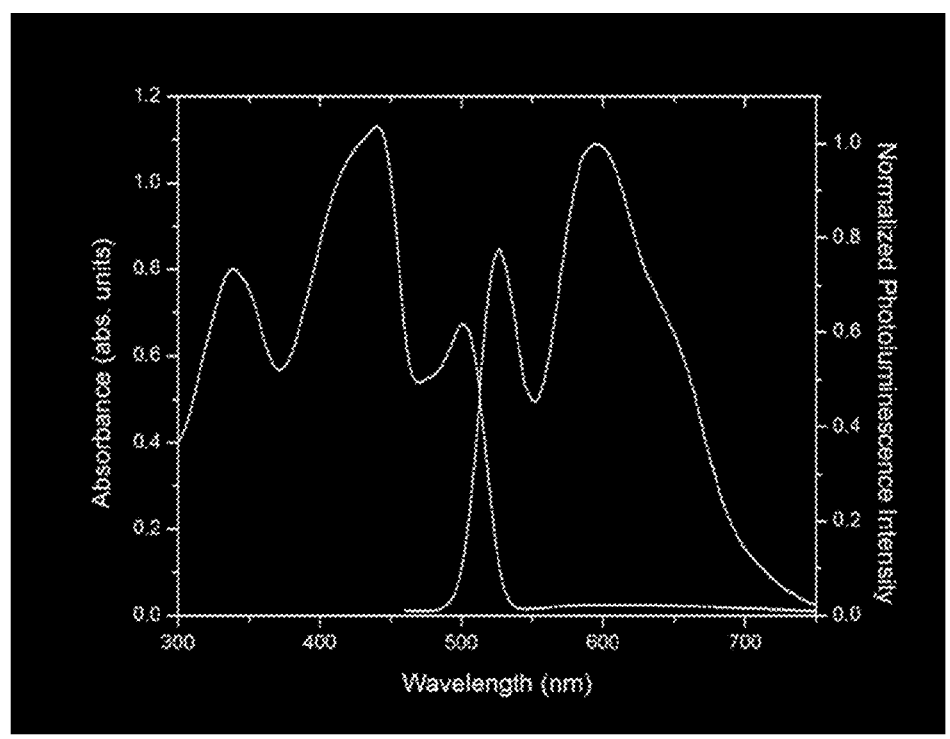
FIGS. 6A-D show the absorption and photoluminescence spectra for a thin film luminescent solar concentrator comprising two or more non-limiting polymers and a light-emitting dye acquired at various configuration and various excitation wavelengths.
Figure 6B:
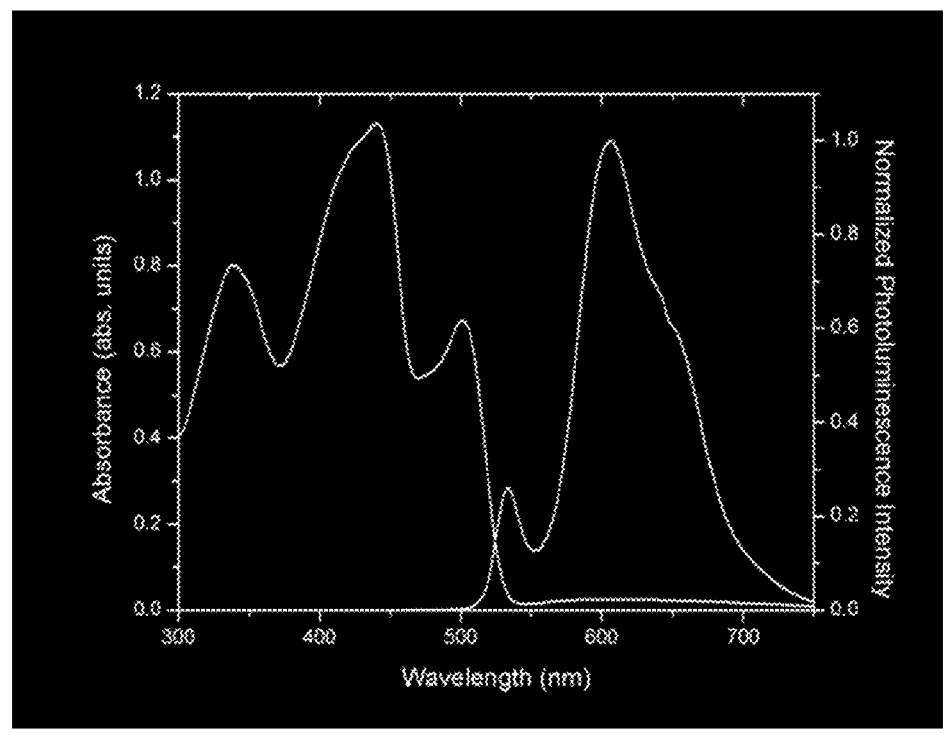
Figure 6C:
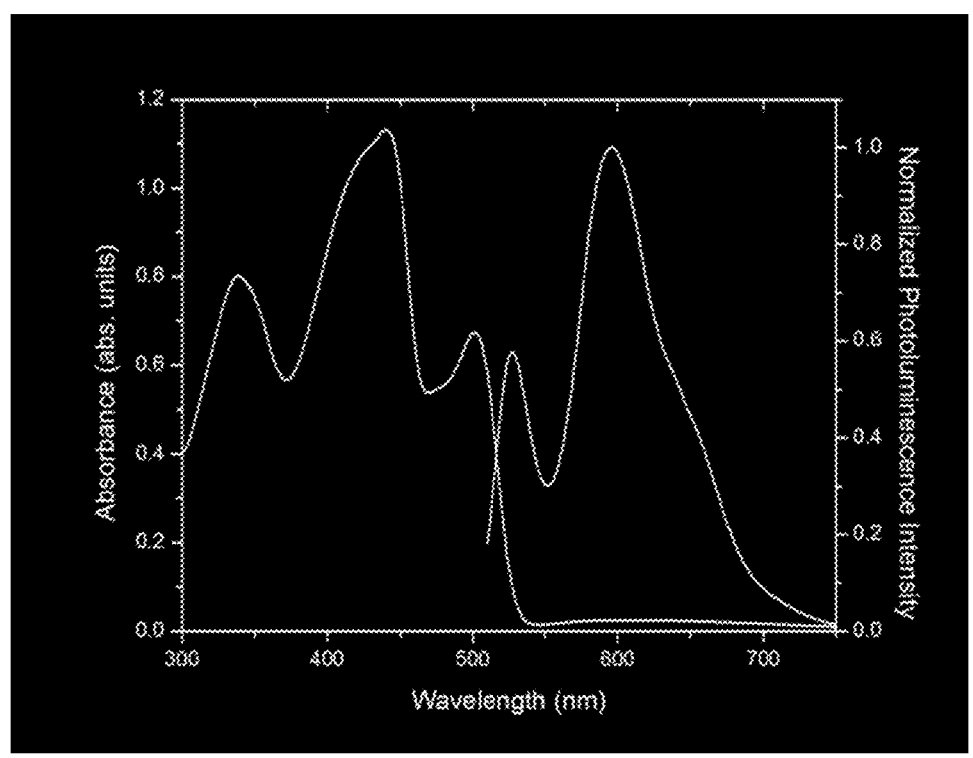
Figure 6D:
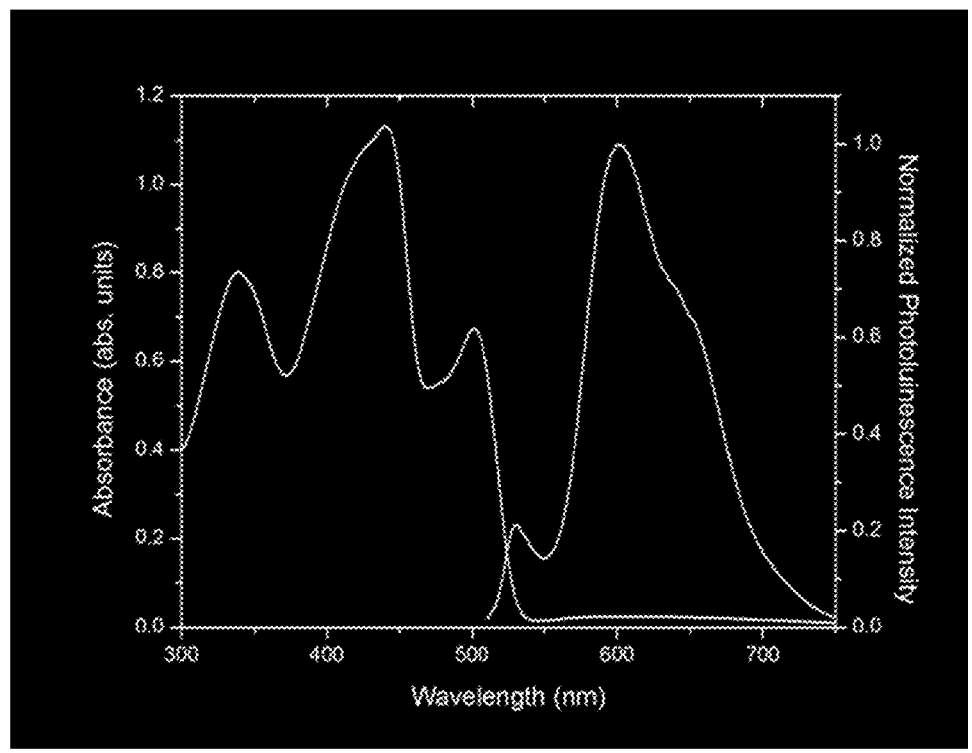

Due to their different optical bandgaps, combination of P1 and P2 yielded a host matrix with a strong, broad absorption spectrum from 300-540 nm, with the absorption maximum at $\lambda$=440 nm primarily attributed to P1. The corresponding spectra demonstrate the strong amplification of the minority Red305, with efficient energy transfer by both polymers from evidenced by excitation of the blend at $\lambda$=440 nm (FIGS. 6A and 6B) and $\lambda$=490 nm (FIGS. 6C and 6D). As observed with single polymer system employing P2, the ratio of the peak intensity of Red305 to P2 was larger at the edges than at the small distance probed by front-face detection along with a slight redshift in the edge emission intensity.

Figure 7A:
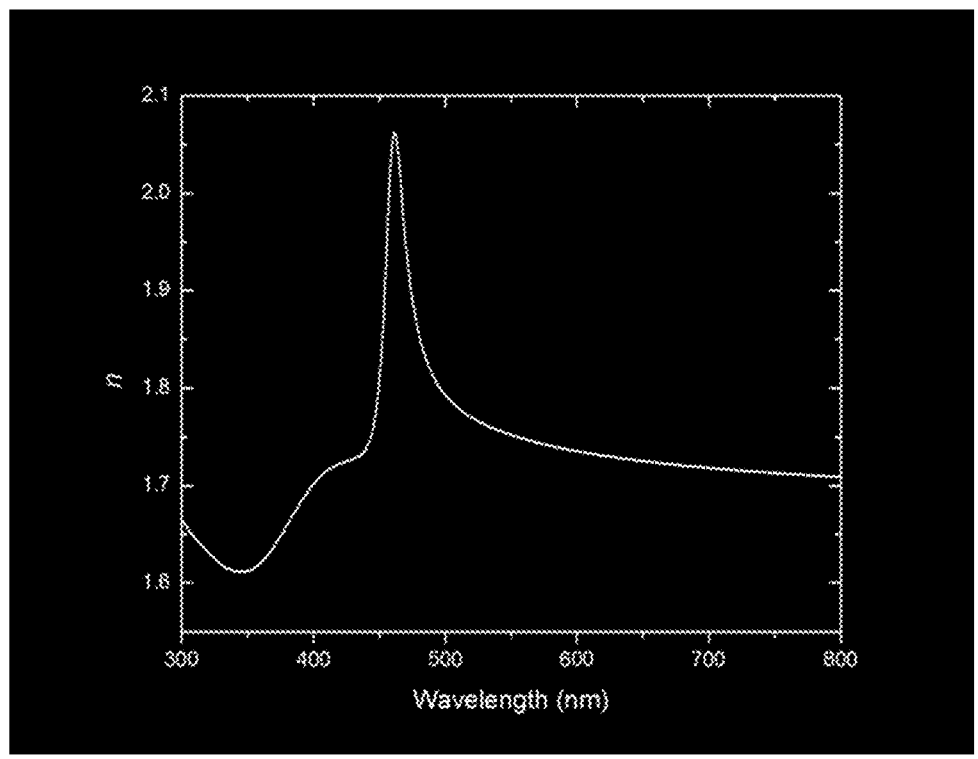
FIG. 7A shows the isotropic refractive index (n) of a composition comprising a non-limiting polymer as a function of wavelength.
Figure 7B:
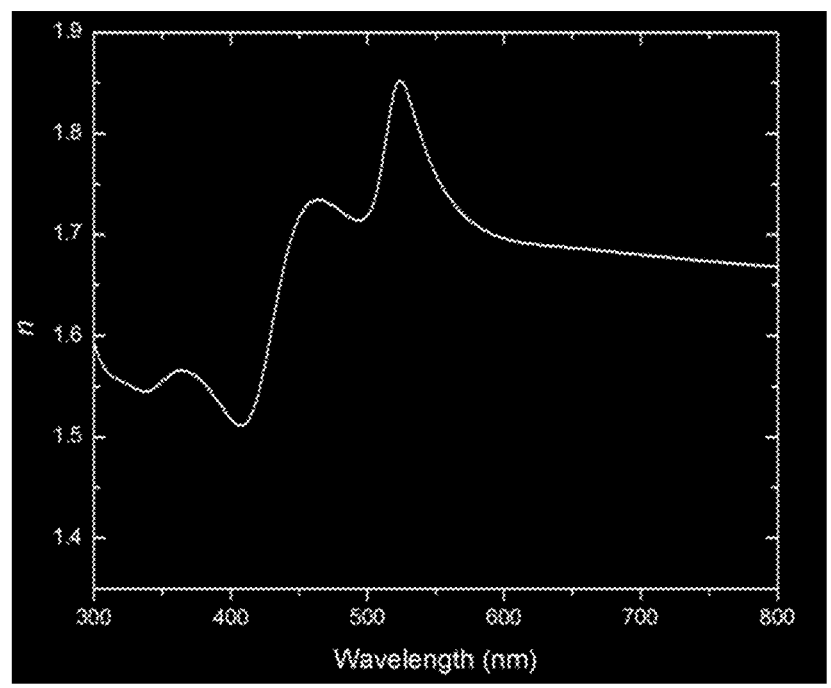
FIG. 7B shows the isotropic refractive index (n) of a composition comprising a 1:1 weight ratio of two non-limiting polymers as a function of wavelength.

To determine the refractive index at the emission wavelengths in the polymeric blend of the poly(arylene ethynylene)-amplifying LSC, P1 and a 1:1 by weight blend of P1 and P2 was examined with variable angle spectroscopic ellipsometry. The measured data was fit using a 0-dimensional standard critical point exciton model or harmonic oscillator model to determine the isotropic optical constants of various polyfluorenes. The refractive index (n) as a function of wavelength for P1 is plotted in FIG. 7A with dispersion consistent with other conjugated polymers. Near the highest emission intensities of Red305 ($\lambda$~600 nm), the refractive index was approximately 1.73. Between the emission wavelengths 550 nm-750 nm of the LSC employing 1:1 P1 and P2, the refractive indices (FIG. 7B) vary from 1.74-1.67, all of which are considerably higher than the refractive index of the glass substrate in the visible spectrum (n~1.52). This higher index material should generally permit efficient waveguiding of emitted light to the edges without risk of optical trapping in the poly(arylene ethynylene) layer, since partial confinement in such a thin film may permit enhanced reabsorption effects by the small amounts of Red305. Nonetheless, the refractive indices determined in the emissive regime of the LSC are relatively low for conjugated polymers, which may be attributed to the high internal free volume of the pentiptycene units decreasing the ability of P1 and P2 to interact with light.

Figure 8:
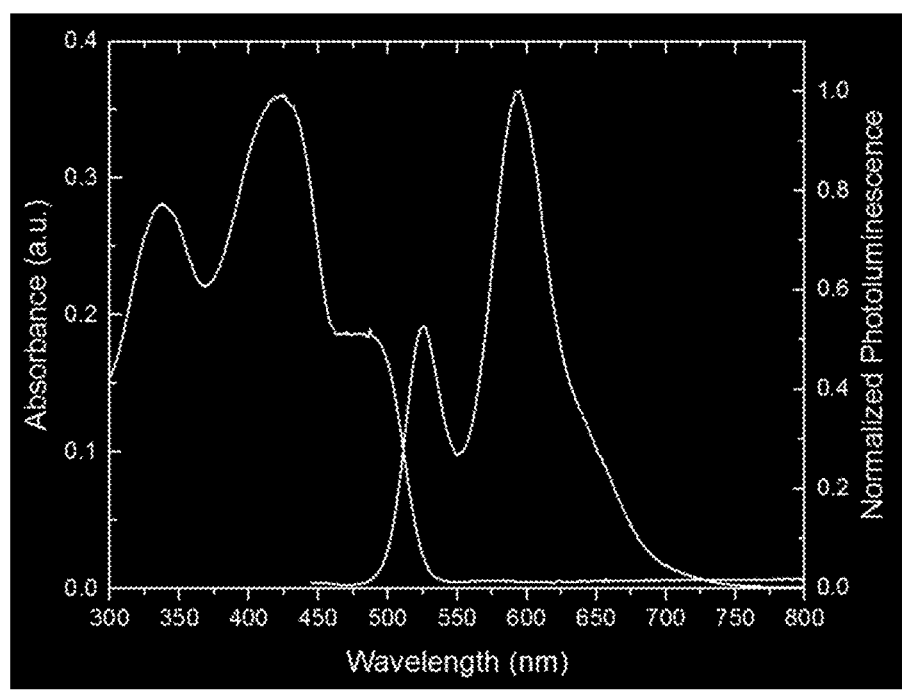
FIG. 8 shows the absorption and photoluminescence spectra for a luminescent solar concentrator comprising two non-limiting polymers and a light-emitting dye.

To demonstrate the use of lower refractive index polymers with inexpensive glass substrates, bulky tert-butyl moieties were inserting along the periphery of the pentiptycene units to produce polymers P3 and P4. A blend of 1:1 by weight P3 and P4 containing 0.5 wt % of a modified Lumogen F Red305 dye (tBuRed305) was spin coated on a soda lime glass substrate. Like the thin film LSCs composed of P2 and P1/P2, increased energy transfer from the polymers to the Red305 derivative was demonstrated in FIG. 8.

Figure 9:
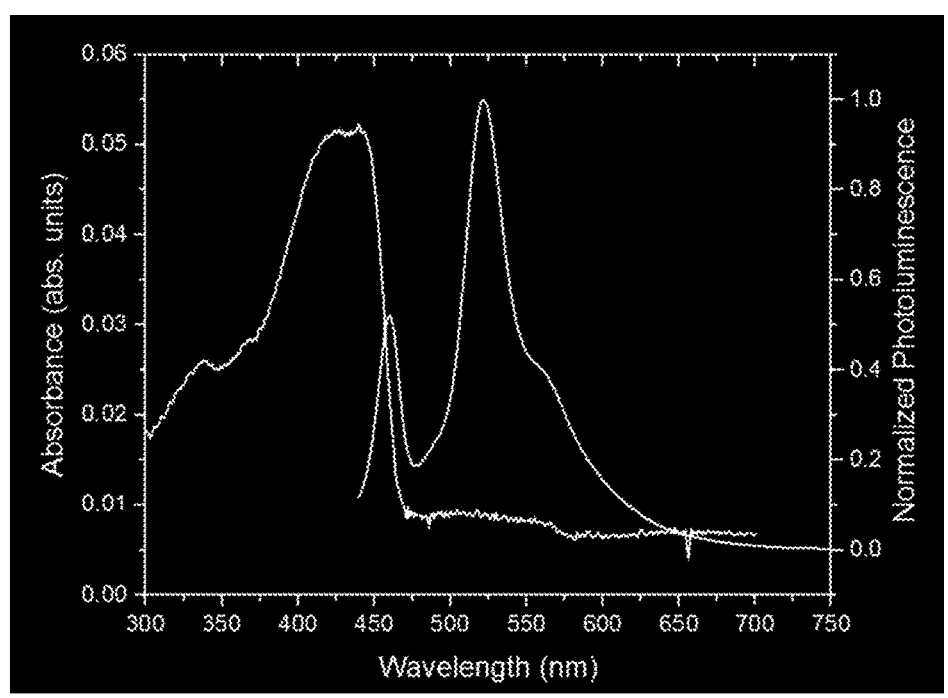
FIG. 9 shows the absorption and photoluminescence spectra for a luminescent solar concentrator comprising two non-limiting polymers in a diluent matrix spin coated on a glass substrate.

FIG. 9 demonstrates efficient energy transfer between P1 and minority amounts of P2 (1 wt % of P2 relative to P1) dispersed in thin PMMA films on top of glass substrates. The photophysical data demonstrates that conjugated polymers may function as terminal species whose luminescence can be greatly amplified by other higher gap semiconducting polymers. The refractive index of PMMA was lower (n~1.48) than that of typical soda-lime or borosilicate glass (n~1.52), thus making it a compatible material for inexpensive waveguides.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed:

1. An article, comprising:
   a substrate; and
   a composition associated with at least one surface of the substrate, the composition comprising:
   a first type of conjugated polymer;
   a second type of conjugated polymer; and
   a light-emitting dye,
   wherein the first type of conjugated polymer comprises a first type of poly(arylene ethynylene), and/or
   wherein the light-emitting dye comprises a perylene bisimide.

2. An article according to claim 1, wherein the second type of conjugated polymer comprises a second type of poly(arylene ethynylene).

3. An article according to claim 1, wherein the composition comprises a third type of conjugated polymer.

4. An article according to claim 1, wherein the light-emitting dye comprises a light-emitting polymer.

5. An article according to claim 1, wherein the perylene bismide is a tert-butylated perylene bisimide.

6. An article according to claim 1, wherein a weight ratio between the first type of conjugated polymer and the second type of conjugated polymer is between about 1:2 and about 2:1.

7. An article according to claim 1, wherein the light-emitting dye is present in the composition in an amount between about 0.1 wt % and about 6 wt % versus the total composition.

8. An article, comprising:
   a substrate; and
   a composition associated with at least one surface of the substrate, wherein the composition comprises:
   a first type of conjugated polymer having a first band gap;
   a second type of conjugated polymer having a second band gap; and
   a diluent matrix or light-emitting dye having a third band gap, wherein the third band gap is less than the first band gap and the second band gap,
   wherein the first type of conjugated polymer comprises a first type of poly(arylene ethynylene), and/or
   wherein the light-emitting dye comprises a perylene bisimide.

9. An article, comprising:
   a substrate; and
   a composition associated with at least one surface of the substrate, the composition comprising:
   a first type of conjugated polymer; and
   a second type of conjugated polymer comprising a light-emitting dye.

* * * * *